United States Patent
Berry, III et al.

(10) Patent No.: US 11,637,022 B2
(45) Date of Patent: Apr. 25, 2023

(54) ELECTRON EXCITATION ATOMIC LAYER ETCH

(71) Applicant: Lam Research Corporation, Fremont, CA (US)

(72) Inventors: Ivan L. Berry, III, San Jose, CA (US); Thorsten Lill, Santa Clara, CA (US); Andreas Fischer, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/250,326

(22) PCT Filed: Jul. 3, 2019

(86) PCT No.: PCT/US2019/040490
§ 371 (c)(1),
(2) Date: Jan. 5, 2021

(87) PCT Pub. No.: WO2020/014065
PCT Pub. Date: Jan. 16, 2020

(65) Prior Publication Data
US 2021/0280433 A1  Sep. 9, 2021

Related U.S. Application Data

(60) Provisional application No. 62/695,419, filed on Jul. 9, 2018.

(51) Int. Cl.
*H01L 21/321* (2006.01)
*H01L 21/3213* (2006.01)
(Continued)

(52) U.S. Cl.
CPC .... *H01L 21/32138* (2013.01); *H01L 21/3065* (2013.01); *H01L 21/31116* (2013.01); *H01L 21/32136* (2013.01); *H01L 21/67069* (2013.01)

(58) Field of Classification Search
None
See application file for complete search history.

(56) References Cited

U.S. PATENT DOCUMENTS

| | | | |
|---|---|---|---|
| 4,313,782 A | 2/1982 | Sokoloski | |
| 4,414,069 A | 11/1983 | Cuomo | |

(Continued)

FOREIGN PATENT DOCUMENTS

| | | | |
|---|---|---|---|
| CN | 102934208 A | 2/2013 | |
| CN | 103117216 A | 5/2013 | |

(Continued)

OTHER PUBLICATIONS

U.S. Office Action, dated May 2, 2007, issued in U.S. Appl. No. 11/479,812.

(Continued)

*Primary Examiner* — Roberts P Culbert
(74) *Attorney, Agent, or Firm* — Weaver Austin Villeneuve & Sampson LLP

(57) ABSTRACT

Disclosed are apparatuses and methods for performing atomic layer etching. A method may include modifying one or more surface layers of material on the substrate and exposing the one or more modified surface layers on the substrate to an electron source thereby removing, without using a plasma, the one or more modified surface layers on the substrate. An apparatus may include a processing chamber, a process gas unit, an electron source, and a controller with instructions configured to cause the process gas unit to flow a first process gas to a substrate in a chamber interior, (Continued)

the first process gas is configured to modify one or more layers of material on the substrate, and to cause the electron source to generate electrons and expose the one or more modified surface layers on the substrate to the electrons, the one or more modified surface layers being removed, without using a plasma.

23 Claims, 12 Drawing Sheets

(51) Int. Cl.
*H01L 21/3065* (2006.01)
*H01L 21/311* (2006.01)
*H01L 21/67* (2006.01)

(56) References Cited

U.S. PATENT DOCUMENTS

| | | | |
|---|---|---|---|
| 4,695,327 A | 9/1987 | Grebinski | |
| 4,756,794 A | 7/1988 | Yoder | |
| 5,030,319 A | 7/1991 | Nishino et al. | |
| 5,078,832 A | 1/1992 | Tanaka | |
| 5,234,540 A | 8/1993 | Grant et al. | |
| 5,268,069 A | 12/1993 | Chapple-Sokol et al. | |
| 5,271,800 A * | 12/1993 | Koontz | H01L 21/31138 |
| | | | 250/251 |
| 5,282,925 A | 2/1994 | Jeng et al. | |
| 5,431,772 A | 7/1995 | Babie et al. | |
| 5,439,553 A | 8/1995 | Grant et al. | |
| 5,474,641 A | 12/1995 | Otsuki et al. | |
| 5,505,816 A | 4/1996 | Barnes et al. | |
| 5,620,559 A | 4/1997 | Kikuchi | |
| 5,635,102 A | 6/1997 | Mehta | |
| 5,636,320 A | 6/1997 | Yu et al. | |
| 5,766,971 A | 6/1998 | Ahlgren et al. | |
| 5,792,275 A | 8/1998 | Natzle et al. | |
| 5,838,055 A | 11/1998 | Kleinhenz et al. | |
| 5,858,830 A | 1/1999 | Yoo et al. | |
| 5,876,879 A | 3/1999 | Kleinhenz et al. | |
| 5,880,032 A | 3/1999 | Doi et al. | |
| 5,913,140 A | 6/1999 | Roche et al. | |
| 5,922,624 A | 7/1999 | Verhaverbeke et al. | |
| 5,968,279 A | 10/1999 | Macleish et al. | |
| 5,976,973 A | 11/1999 | Ohira et al. | |
| 5,990,019 A | 11/1999 | Torek et al. | |
| 5,994,240 A | 11/1999 | Thakur | |
| 6,030,881 A | 2/2000 | Papasouliotis et al. | |
| 6,069,092 A | 5/2000 | Imai et al. | |
| 6,071,815 A | 6/2000 | Kleinhenz et al. | |
| 6,074,951 A | 6/2000 | Kleinhenz et al. | |
| 6,146,970 A | 11/2000 | Witek et al. | |
| 6,204,198 B1 | 3/2001 | Banerjee et al. | |
| 6,265,302 B1 | 7/2001 | Lim et al. | |
| 6,335,261 B1 | 1/2002 | Natzle et al. | |
| 6,483,154 B1 | 11/2002 | Ngo et al. | |
| 6,573,181 B1 | 6/2003 | Srinivas et al. | |
| 6,652,713 B2 | 11/2003 | Brown et al. | |
| 6,693,050 B1 | 2/2004 | Cui et al. | |
| 6,706,334 B1 | 3/2004 | Kobayashi et al. | |
| 6,716,691 B1 | 4/2004 | Evans et al. | |
| 6,726,805 B2 | 4/2004 | Brown et al. | |
| 6,740,247 B1 | 5/2004 | Han et al. | |
| 6,774,000 B2 | 8/2004 | Natzle et al. | |
| 6,776,874 B2 | 8/2004 | Kobayashi et al. | |
| 6,790,733 B1 | 9/2004 | Natzle et al. | |
| 6,803,309 B2 | 10/2004 | Chou et al. | |
| 6,817,776 B2 | 11/2004 | Colgan et al. | |
| 6,837,968 B2 | 1/2005 | Brown et al. | |
| 6,852,584 B1 | 2/2005 | Chen et al. | |
| 6,858,532 B2 | 2/2005 | Natzle et al. | |
| 6,905,965 B2 | 6/2005 | Subrahmanyan et al. | |
| 6,926,843 B2 | 8/2005 | Cantell et al. | |
| 6,949,481 B1 | 9/2005 | Hallijal et al. | |
| 6,951,821 B2 | 10/2005 | Hamelin et al. | |
| 6,967,167 B2 | 11/2005 | Geiss et al. | |
| 6,992,011 B2 | 1/2006 | Nemoto et al. | |
| 7,029,536 B2 | 4/2006 | Hamelin et al. | |
| 7,033,909 B2 | 4/2006 | Kim et al. | |
| 7,052,941 B2 | 5/2006 | Lee et al. | |
| 7,079,760 B2 | 7/2006 | Hamelin et al. | |
| 7,163,899 B1 | 1/2007 | Cho et al. | |
| 7,416,989 B1 | 8/2008 | Liu et al. | |
| 7,435,661 B2 | 10/2008 | Miller et al. | |
| 7,651,922 B2 | 1/2010 | Matsuda | |
| 7,977,249 B1 | 7/2011 | Liu et al. | |
| 7,981,763 B1 | 7/2011 | Van Schravendijk et al. | |
| 8,043,972 B1 | 10/2011 | Liu et al. | |
| 8,058,179 B1 | 11/2011 | Draeger et al. | |
| 8,187,486 B1 | 5/2012 | Liu et al. | |
| 8,617,348 B1 | 12/2013 | Liu et al. | |
| 9,425,041 B2 | 8/2016 | Berry, III et al. | |
| 9,431,268 B2 | 8/2016 | Lill et al. | |
| 9,443,701 B2 * | 9/2016 | Watanabe | H01L 21/76897 |
| 9,773,683 B2 | 9/2017 | Gupta et al. | |
| 10,679,868 B2 | 6/2020 | Berry, III et al. | |
| 11,380,556 B2 | 7/2022 | Panagopoulos et al. | |
| 2001/0016226 A1 | 8/2001 | Natzle et al. | |
| 2002/0106908 A1 | 8/2002 | Cohen et al. | |
| 2003/0029568 A1 | 2/2003 | Brown et al. | |
| 2003/0134038 A1 | 7/2003 | Paranjpe | |
| 2004/0018740 A1 | 1/2004 | Brown et al. | |
| 2004/0083977 A1 | 5/2004 | Brown et al. | |
| 2004/0110354 A1 | 6/2004 | Natzle et al. | |
| 2004/0182324 A1 | 9/2004 | Wallace et al. | |
| 2004/0184792 A1 | 9/2004 | Hamelin et al. | |
| 2004/0185670 A1 | 9/2004 | Hamelin et al. | |
| 2004/0200244 A1 | 10/2004 | Hung et al. | |
| 2004/0212035 A1 | 10/2004 | Yeo et al. | |
| 2004/0226814 A1 * | 11/2004 | Stewart | G03F 1/74 |
| | | | 430/5 |
| 2005/0056370 A1 | 3/2005 | Brown et al. | |
| 2005/0101130 A1 | 5/2005 | Lopatin et al. | |
| 2005/0106877 A1 | 5/2005 | Elers et al. | |
| 2005/0116300 A1 | 6/2005 | Hieda et al. | |
| 2005/0153519 A1 | 7/2005 | Lu et al. | |
| 2005/0205110 A1 | 9/2005 | Kao et al. | |
| 2005/0218113 A1 | 10/2005 | Yue | |
| 2005/0218507 A1 | 10/2005 | Kao et al. | |
| 2005/0221552 A1 | 10/2005 | Kao et al. | |
| 2005/0230350 A1 | 10/2005 | Kao et al. | |
| 2005/0266684 A1 | 12/2005 | Lee et al. | |
| 2005/0270895 A1 | 12/2005 | Strang | |
| 2006/0003596 A1 | 1/2006 | Fucsko et al. | |
| 2006/0051966 A1 | 3/2006 | Or et al. | |
| 2006/0115937 A1 | 6/2006 | Barnett et al. | |
| 2006/0207968 A1 | 9/2006 | Mumbauer et al. | |
| 2006/0270239 A1 | 11/2006 | Triyoso et al. | |
| 2007/0063277 A1 | 3/2007 | Belyansky et al. | |
| 2007/0215975 A1 | 9/2007 | Idani et al. | |
| 2008/0038894 A1 * | 2/2008 | Rueger | H01L 21/31144 |
| | | | 438/308 |
| 2008/0233709 A1 | 9/2008 | Conti et al. | |
| 2009/0181553 A1 | 7/2009 | Koelmel et al. | |
| 2010/0062602 A1 | 3/2010 | Sakamoto et al. | |
| 2011/0056625 A1 | 3/2011 | Rueger et al. | |
| 2015/0118848 A1 | 4/2015 | Draeger et al. | |
| 2015/0132961 A1 | 5/2015 | Chang et al. | |
| 2016/0196969 A1 | 7/2016 | Berry, III et al. | |
| 2016/0196984 A1 | 7/2016 | Lill et al. | |
| 2016/0329221 A1 | 11/2016 | Berry, III et al. | |
| 2017/0221781 A1 | 8/2017 | Theisen et al. | |
| 2017/0256416 A1 | 9/2017 | Fischer et al. | |
| 2017/0345665 A1 | 11/2017 | Faguet et al. | |
| 2017/0365478 A1 | 12/2017 | George et al. | |
| 2019/0131120 A1 | 5/2019 | Yamaguchi | |
| 2021/0104414 A1 | 4/2021 | Panagopoulos et al. | |
| 2022/0293431 A1 | 9/2022 | Panagopoulos et al. | |

FOREIGN PATENT DOCUMENTS

| | | |
|---|---|---|
| EP | 298879 | 1/1989 |
| JP | 74041461 B | 11/1974 |
| JP | H04223329 A | 8/1992 |

(56) References Cited

FOREIGN PATENT DOCUMENTS

| JP | 05-029266 A | 2/1993 |
|---|---|---|
| JP | 05-190517 A | 7/1993 |
| JP | 06-295889 A | 10/1994 |
| JP | H 09-102490 A | 4/1997 |
| JP | 2006-261451 A | 9/2006 |
| KR | 10-2005-0110751 | 11/2005 |
| KR | 10-2006-0000876 | 1/2006 |
| KR | 10-2007-0029851 A | 3/2007 |
| WO | WO 2004/001809 | 12/2003 |
| WO | WO 2017/205658 | 11/2017 |

OTHER PUBLICATIONS

U.S. Final Office Action, dated Jul. 17, 2007, issued in U.S. Appl. No. 11/479,812.
U.S. Office Action, dated Dec. 5, 2007, issued in U.S. Appl. No. 11/479,812.
U.S. Final Office Action, dated May 7, 2008, issued in U.S. Appl. No. 11/479,812.
U.S. Notice of Allowance, dated Jul. 1, 2008, issued in U.S. Appl. No. 11/479,812.
U.S. Office Action, dated Feb. 15, 2011, issued in U.S. Appl. No. 12/174,402.
U.S. Notice of Allowance, dated Jul. 13, 2011, issued in U.S. Appl. No. 12/174,402.
U.S. Notice of Allowance, dated Mar. 7, 2011, issued in U.S. Appl. No. 12/074,912.
U.S. Office Action, dated Jun. 9, 2011, issued in U.S. Appl. No. 12/002,171.
U.S. Final Office Action, dated Nov. 17, 2011, issued in U.S. Appl. No. 12/002,171.
U.S. Office Action, dated Apr. 12, 2011, issued in U.S. Appl. No. 12/002,085.
U.S. Office Action, dated Sep. 30, 2011, issued in U.S. Appl. No. 12/002,085.
U.S. Notice of Allowance, dated Feb. 3, 2012, issued in U.S. Appl. No. 12/002,085.
U.S. Office Action, dated Jan. 17, 2013, issued in U.S. Appl. No. 13/461,080.
U.S. Final Office Action, dated Jun. 26, 2013, issued in U.S. Appl. No. 13/461,080.
U.S. Notice of Allowance, dated Aug. 28, 2013, issued in U.S. Appl. No. 13/461,080.
U.S. Office Action, dated Feb. 3, 2011, issued in U.S. Appl. No. 12/244,241.
U.S. Office Action, dated Jan. 29, 2010, issued in U.S. Appl. No. 12/144,518.
U.S. Office Action, dated Jun. 14, 2010, issued in U.S. Appl. No. 12/144,518.
U.S. Office Action, dated Jun. 11, 2010, issued in U.S. Appl. No. 12/341,943.
U.S. Final Office Action, dated Dec. 23, 2010, issued in U.S. Appl. No. 12/341,943.
U.S. Notice of Allowance, dated Mar. 15, 2011, issued in U.S. Appl. No. 12/341,943.
U.S. Office Action, dated Apr. 21, 2011, issued in U.S. Appl. No. 12/343,102.
U.S. Notice of Allowance, dated Sep. 14, 2011, issued in U.S. Appl. No. 12/343,102.
U.S. Office Action, dated Nov. 22, 2013, issued in U.S. Appl. No. 13/244,032.
U.S. Final Office Action, dated Jul. 2, 2014, issued in U.S. Appl. No. 13/244,032.
U.S. Office Action, dated Apr. 9, 2015, issued in U.S. Appl. No. 14/531,483.
U.S. Office Action, dated Dec. 30, 2015, issued in U.S. Appl. No. 14/531,483.
U.S. Office Action, dated Dec. 21, 2015, issued in U.S. Appl. No. 14/589,610.
U.S. Notice of Allowance, dated May 2, 2016, issued in U.S. Appl. No. 14/589,610.
U.S. Office Action, dated Mar. 1, 2016, issued in U.S. Appl. No. 14/590,801.
U.S. Notice of Allowance, dated Jul. 12, 2016, issued in U.S. Appl. No. 14/590,801.
U.S. Office Action, dated Dec. 3, 2018, issued in U.S. Appl. No. 15/216,257.
U.S. Final Office Action, dated May 21, 2019 issued in U.S. Appl. No. 15/216,257.
U.S. Office Action, dated Sep. 23, 2019 issued in U.S. Appl. No. 15/216,257.
U.S. Notice of Allowance dated Feb. 10, 2020 issued in U.S. Appl. No. 15/216,257.
Korean Office Action dated Apr. 8, 2014, issued in KR 10-2008-0063247.
European Extended Search Report dated May 30, 2016 issued in Application No. EP 15200663.1.
Chinese First Office Action dated Dec. 22, 2017 issued in Application No. CN 201511027151.7.
Chinese Second Office Action dated Aug. 16, 2018 issued in Application No. CN 201511027151.7.
Chinese Decision of Final Rejection Action dated Feb. 11, 2019 issued in Application No. CN 201511027151.7.
Chinese Third Office Action [Reinstated] dated Jul. 15, 2019 issued in Application No. CN 201511027151.7.
Chinese Fourth Office Action dated Sep. 27, 2019 issued in Application No. CN 201511027151.7.
Japanese First Office Action dated Jan. 28, 2020 issued in Application No. JP 2015-250922.
Singapore Notice of Allowance and Supplementary Examination Report dated Jul. 1, 2019 issued in Application No. SG 10201600021U.
Taiwan First Office Action dated dated Jun. 27, 2019 issued in Application No. TW 104143047.
Taiwan Notice of Allowance dated Oct. 1, 2019 issued in Application No. TW 104143047.
Chinese First Office Action dated Dec. 5, 2017 issued in Application No. CN 201511021815.9.
Chinese Second Office Action dated Jul. 31, 2018 issued in Application No. CN 201511021815.9.
Chinese Third Office Action dated Jan. 22, 2019 issued in Application No. CN 201511021815.9.
Chinese Decision of Final Rejection dated Apr. 25, 2019 issued in Application No. CN 201511021815.9.
Chinese Fourth Office Action dated Sep. 27, 2019 issued in Application No. CN 201511021815.9.
Chinese Notice of Allowance, dated Nov. 26, 2019 issued in Application No. CN 201511021815.9.
International Search Report and Written Opinion dated Aug. 22, 2019 issued in Application No. PCT/US2019/031165.
International Preliminary Report on Patentability dated Dec. 10, 2020 issued in Application No. PCT/US2019/031165.
International Search Report and Written Opinion dated Oct. 31, 2019 issued in Application No. PCT/US2019/040490.
International Preliminary Report on Patentability dated Jan. 21, 2021 issued in Application No. PCT/US2019/040490.
Athavale et al. (1995) "Molecular dynamics simulation of atomic layer etching of silicon," J. Vac. Sci. Technol. A, 13(3):966-971.
Byun et al. (2001) "The Effects of Reactive Precleaning (RPC+) on the Formation of Titanium Silicide by PECVD TiCl4—Ti Deposition, and Its Thermal Stability," IEEE, pp. 222-224.
Chang et al. (1997) "Interface Characteristics of Selective Tungsten on Silicon Using a New Pretreatment Technology for ULSI Application," IEEE, pp. 738 743.
Chen et al., "Directional etch of magnetic and noble metals. II. Organic chemical vapor etch" Journal of Vacuum Science & Technology A: Vacuum, Surfaces, and Films, vol. 35, 05C305 (2017) pp. 1-8. <doi:10.1116/1.4983830>.
George, et al., "Prospects for Thermal Atomic Layer Etching Using Sequential, Self-Limiting Fluorination and Ligand-Exchange Reactions" ACS Nano (2016) vol. 10, 4889-4894.
Honda et al. (2005) "Chemical Dry Cleaning Technology for Reliable 65nm CMOS contact to NiSix," IITC, paper 9.4.

(56) References Cited

OTHER PUBLICATIONS

Jang et al. (2002) "Fabrication o MEMS devices by using anhydrous HF gas-phase etching with alcoholic vapor," Journal of Micromechanics and Microengineering, 12:297-306.

Kim et al. (2003) "New Contact Cleaning in HF & N2/H2 Microwave Plasma," Solid State Phenomena, 92:239-242.

Matsuo et al. (Sep./Oct. 1999) "Silicon etching in NF3/O2 remote microwave plasmas," J. Vac. Sci. Technol. A, 17(5):2431-2437.

Meguro et al. (1990) "Digital etching of GaAs: New approach of dry etching to atomic ordered processing," American Institute of Physics pp. 1552-1554.

Natzle et al. (2004) "Trimming of hard-masks by Gaseous Chemical Oxide Removal (COR) for Sub-10nm Gates/Fins, for Gate Length Control and for Embedded Logic," 2004 IEEE/SEMI Advanced Semiconductor Manufacturing Conference, pp. 61-65.

Nishino et al. (1993) "Damage-free selective etching of Si native oxides using NH3/NF3 and SF6/H2O down-flow etching," J. Appl. Phys. 74(2):1345-1348.

Ogawa et al. (2002) "Dry Cleaning Technology for Removal of Silicon Native Oxide Employing Hot NH3/NF3 Exposure," The Japan Society of Applied Physics, Part I, No. 8, pp. 5349-5358.

Okamura et al. (2004) "Low Damage via Formation with Low Resistance by NH3 Thermal Reduction for Cu / Ultra Low-k Interconnects," IEEE, pp. 42-44.

Park et al. (1996) "Low Damage In Situ Contact Cleaning Method by a Highly Dense and Directional ECR Plasma," Jpn J. Appl. Phys 35:1097-1101.

Park et al. (2005) "Atomic Layer Etching of Si(100) and Si(111) Using Cl2 and Ar Neutral Beam," Electrochemical and Solid-State Letters, 8(8) C106-C109.

Phan et al. (2006) "Integrated Clean Process Using NF3/NH3 Remote Plasma for Nickle Silicide Formation," SEMICON Korea STS 2006, pp. 159-163.

Taguwa et al. (2000) "ICP-Ar/H2 Precleaning and Plasma Damage-Free Ti-PECVD for Sub-Quarter Micron Contact of Logic with Embedded DRAM," Conference Proceedings USLI XV 2000, pp. 589-593.

Torek et al. (1995) "Reduced pressure etching of thermal oxides in anhydrous HF/alcoholic gas mixtures" Journal of the Electrochemical Society, vol. 142, No. 4, Apr. 1995, pp. 1322-1326. <ISSN:0013-4651>.

Wang et al. (1998) "Ultrahigh-selectivity silicon nitride etch process using an inductively coupled plasma source," J. Vac. Sci. Technol. A, 16(3):1582-1587.

Yun et al. (2007) "Large Etch Rate Enhancement by NO-Induced Surface Chemical Reaction during Chemical Dry Etching of Silicon Oxide in F2 Remote Plasmas" Journal of The Elctrochemical Society, vol. 154, No. 4, pp. D267-D272.

U.S. Appl. No. 12/002,171, filed Dec. 14, 2007, Van Schravendijk et al.

U.S. Appl. No. 12/244,241, filed Oct. 2, 2008, Drewery et al.

U.S. Appl. No. 12/144,518, filed Jun. 23, 2008, Drewery et al.

U.S. Appl. No. 13/244,032, filed Sep. 23, 2011, Draeger et al.

U.S. Appl. No. 17/103,519, filed Nov. 24, 2020, Panagopoulos et al.

U.S. Office Action dated Jun. 4, 2021 issued in U.S. Appl. No. 17/103,519.

Extended European Search Report dated Mar. 14, 2022, in Application No. 19833221.5.

U.S. Advisory Action dated Feb. 11, 2022 in U.S. Appl. No. 17/103,519.

U.S. Final Office Action dated Dec. 2, 2021 in U.S. Appl. No. 17/103,519.

U.S. Notice of Allowance dated Mar. 2, 2022, in U.S. Appl. No. 17/103,519.

KR Office Action dated Sep. 28, 2022 in Application No. KR10-2016-0000420.

* cited by examiner

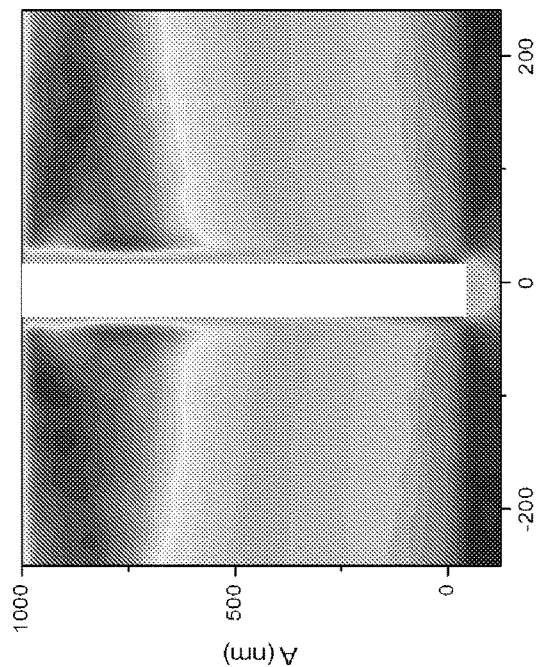
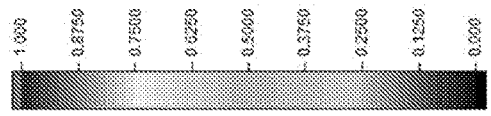
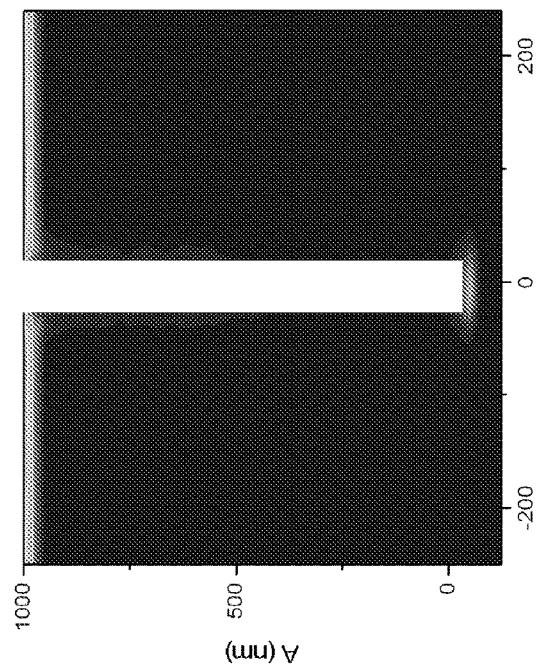
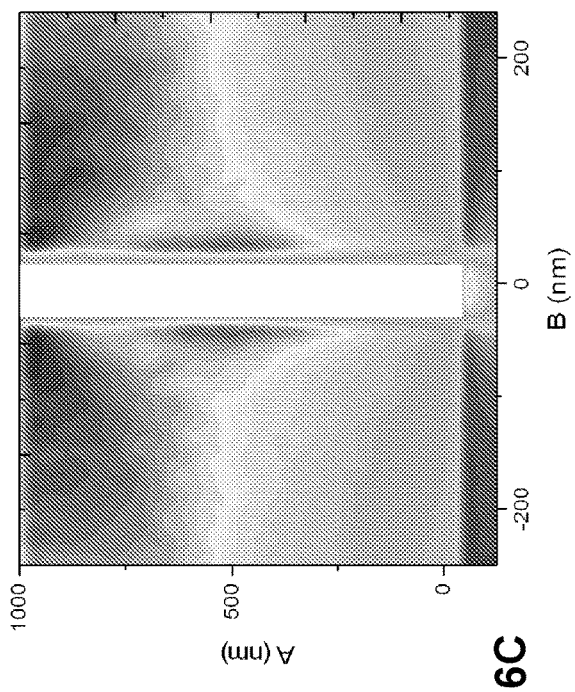
Figure 6A
Figure 6B
Figure 6C

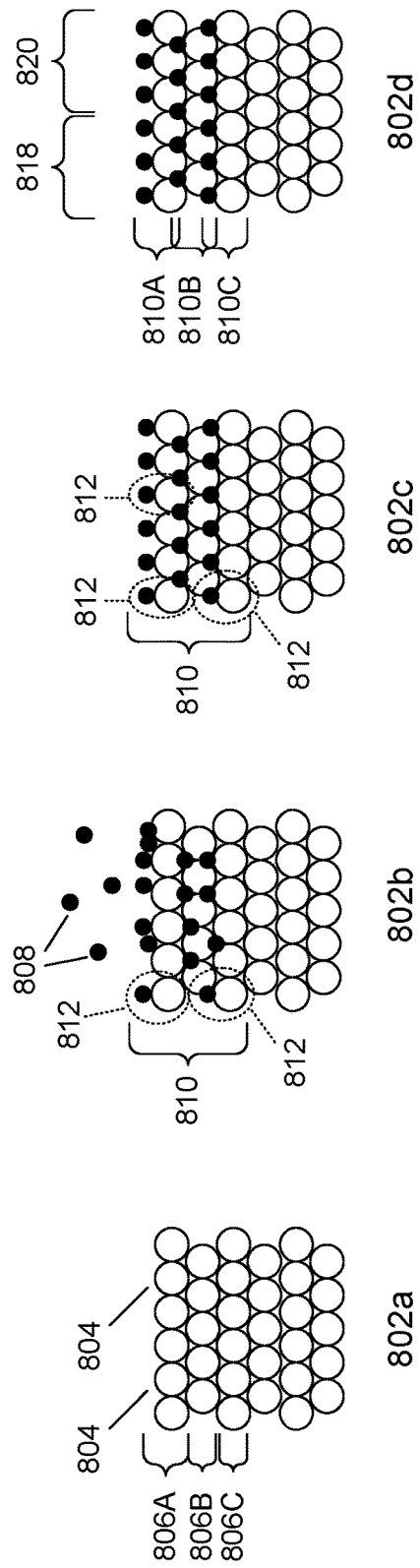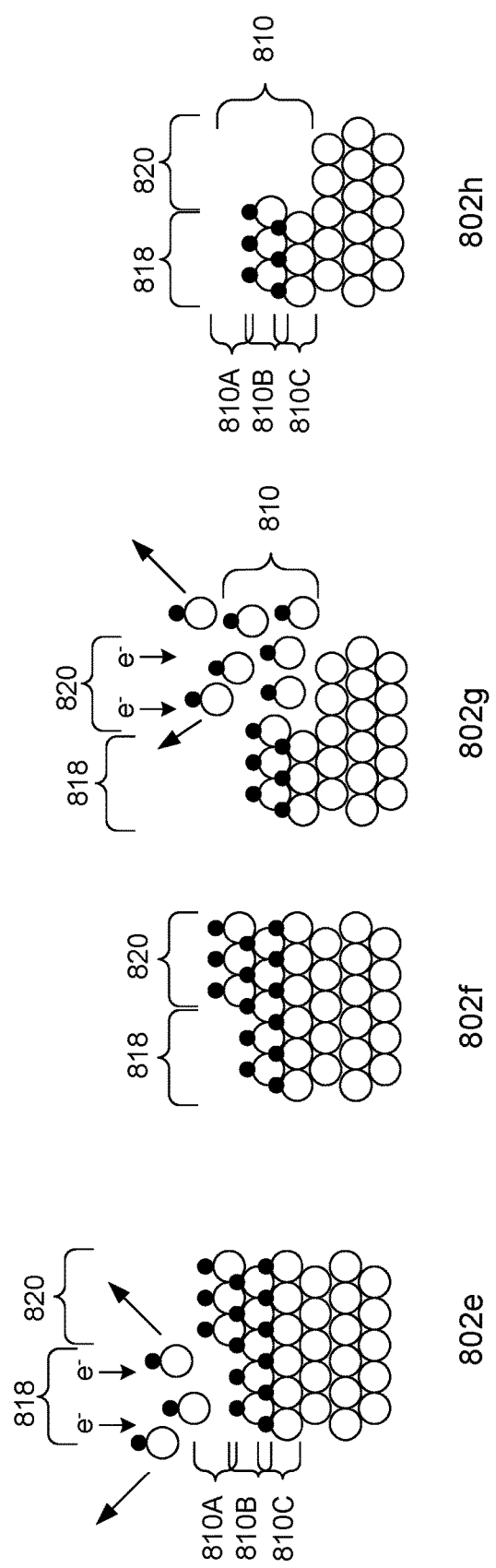
Figure 8

ELECTRON EXCITATION ATOMIC LAYER ETCH

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Semiconductor fabrication often involves patterning schemes and other processes whereby some materials are selectively etched to prevent etching of other exposed surfaces of a substrate. As device geometries become smaller and smaller, high etch selectivity processes are desirable to achieve effective etching of desired materials without plasma assistance.

SUMMARY

In some embodiments a method of processing a substrate is provided. The method may include modifying one or more surface layers of material on the substrate, and exposing the one or more modified surface layers on the substrate to an electron source thereby removing, without using a plasma, the one or more modified surface layers on the substrate.

In some embodiments, the exposing may further include simultaneously exposing all of the one or more modified surface layers on the substrate to the electron source.

In some embodiments, the exposing may further include exposing a first section of the one or more modified surface layers to the electron source.

In some such embodiments, only the first section of the one or more modified surface layers may be exposed to the electron source while a second section of the one or more modified surface layers may not be exposed to the electron source.

In some such embodiments, the exposing may further include exposing a second section of the one or more modified surface layers to the electron source after the exposing of the first section.

In some further embodiments, the exposing may further include exposing the first section of the one or more modified surface layers to the electron source at a first beam energy level, and exposing the second section of the one or more modified surface layers to the electron source at a second beam energy level.

In some further embodiments, the exposing may further include exposing the first section of the one or more modified surface layers to the electron source for a first time period, and exposing the second section of the one or more modified surface layers to the electron source for a second time period.

In some embodiments, the method may further include neutralizing, after the exposing, a charge on the substrate.

In some embodiments, the exposing may further include exposing the one or more modified surface layers on the substrate to the electron source at a beam energy level that is sufficient to cause anisotropic removal of the one or more modified surface layers from the substrate.

In some embodiments, the exposing may further include exposing the one or more modified surface layers on the substrate to the electron source at a beam energy level that is sufficient to cause isotropic removal of the one or more modified surface layers from the substrate.

In some embodiments, the exposing may further include exposing the one or more modified surface layers on the substrate to the electron source at a beam energy level that is sufficient to cause partial anisotropic removal of the one or more modified surface layers from the substrate.

In some embodiments, the method may further include flowing, before or during the modifying, a first process gas onto the substrate, and the first process gas is configured to modify the one or more surface layers of material on the substrate.

In some embodiments, the modifying may further include exposing the one or more surface layers of material on the substrate to a plasma.

In some embodiments, the method may further include repeating, while the substrate remains in a processing chamber, the modifying of one or more surface layers of material on the substrate and the exposing the one or more modified surface layers on the substrate to the electron source.

In some such embodiments, the method may further include purging the processing chamber between modifying and exposing operations.

In some embodiments, the material may have a surface binding energy of less than about 4.5 electron volts (eV).

In some such embodiments, the material may be copper, aluminum, germanium, gold, or silver.

In some such embodiments, substrate temperature during the modifying and the exposing is substantially the same.

In some embodiments, a method of processing a substrate may be provided. The method may include modifying one or more surface layers of material on the substrate, converting, after the modifying, the one or more modified surface layers on the substrate to one or more converted layers, and exposing the one or more converted layers on the substrate to an electron source thereby removing, without using a plasma, the one or more converted surface layers on the substrate.

In some embodiments, the converting may further include flowing a second process gas onto the substrate, and the second process gas is configured to convert the one or more modified surface layers on the substrate to the one or more converted layers.

In some such embodiments, the modifying may further include exposing the one or more surface layers of material on the substrate to a plasma.

In some such embodiments, the converting may further include exposing the one or more surface layers of material on the substrate to a plasma.

In some embodiments, an apparatus for semiconductor processing may be provided. The apparatus may include a processing chamber that includes chamber walls that at least partially bound a chamber interior, a wafer support for positioning a substrate in the chamber interior, a process gas unit configured to flow a first process gas into the chamber interior and onto the substrate in the chamber interior, an electron source configured to expose electrons to the substrate positioned on the wafer support, and a controller that includes instructions that are configured to cause the process gas unit to flow the first process gas to the substrate in the chamber interior, the first process gas being configured to modify one or more layers of material on the substrate, and to cause the electron source to generate the electrons and thereby expose the one or more modified surface layers on the substrate to the electrons, the one or more modified surface layers being removed, without using a plasma.

In some embodiments, the apparatus may further include a vacuum unit configured to evacuate gases from the chamber interior, and the controller may further include instructions configured to cause the vacuum unit to generate a vacuum in the chamber interior and purge gases from the chamber interior.

In some embodiments, the apparatus may further include a charge neutralization unit configured to neutralize a charge of the substrate, and the controller further comprises instructions configured to cause the charge neutralization unit to neutralize the charge of the substrate.

In some such embodiments, the charge neutralization unit may be at least one of a plasma source, an ultraviolet light source, and the electron source.

In some embodiments, the apparatus may further include a plasma generator configured to generate a plasma in the chamber interior. The plasma generator may be one of a capacitively coupled plasma, an inductively coupled plasma, an upper remote plasma, or a lower remote plasma. The controller may further include instructions configured to cause the plasma generator to generate the plasma in the chamber interior.

In some embodiments, the apparatus may further include an isolation valve or shutter interposed between the chamber interior and the electron source, and the isolation valve or shutter are configured to allow the electrons to reach the chamber interior.

BRIEF DESCRIPTION OF THE DRAWINGS

FIGS. 6A-6C depict electron penetrations into a material with a slot.

FIG. 8 depicts an example schematic illustration of a different electron excitation ALE cycle.

DETAILED DESCRIPTION

Figure 1:
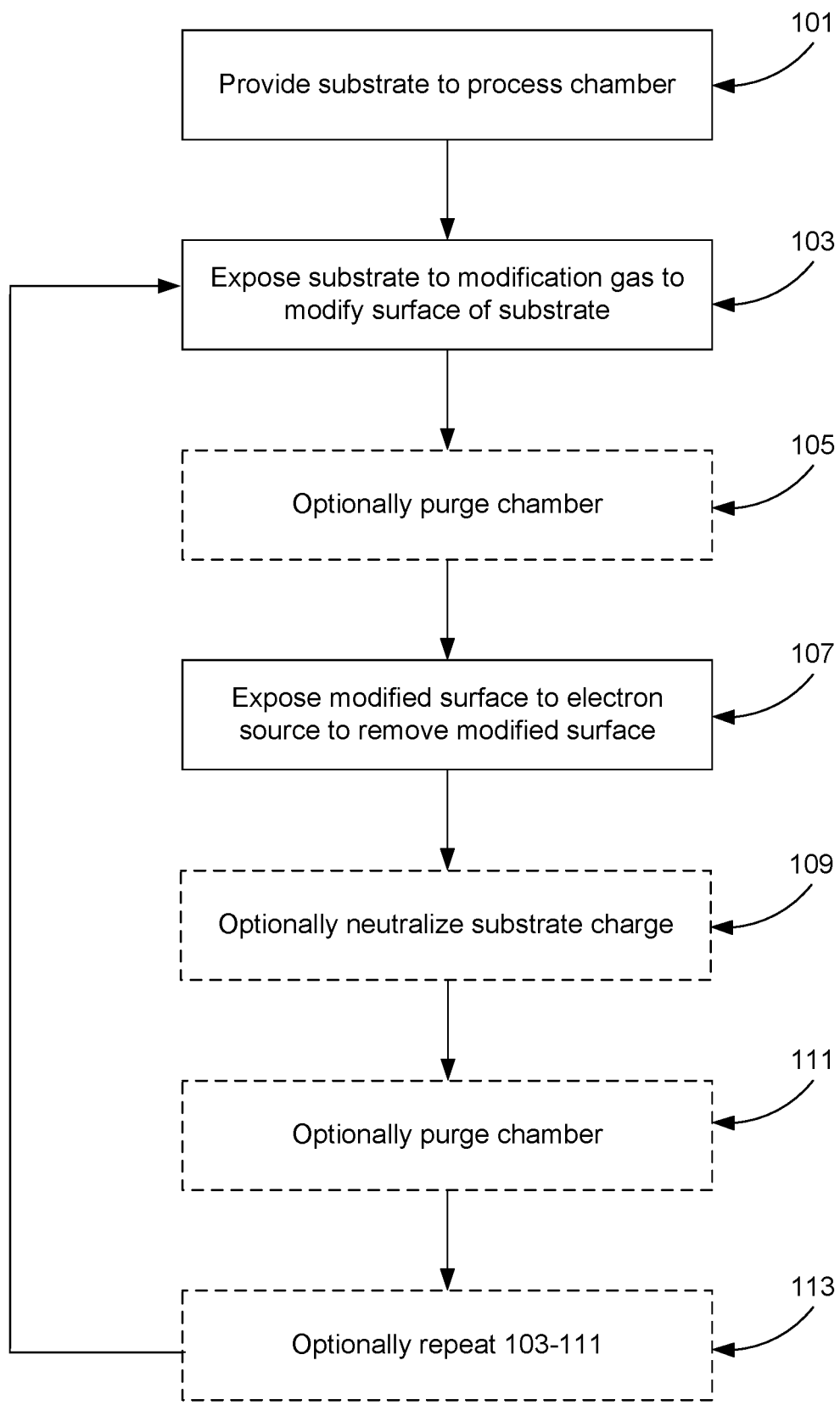
FIG. 1 depicts an example process flow diagram for performing operations in accordance with disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Conventional ALE Processing

Semiconductor fabrication processes often involve patterning and etching of various materials, including conductors, semiconductors, and dielectrics. Some examples include conductors, such as metals or carbon; semiconductors, such as silicon or germanium; and dielectrics, such as silicon oxide, aluminum dioxide, zirconium dioxide, hafnium dioxide, silicon nitride, and titanium nitride. Atomic layer etching ("ALE") processes remove thin layers of material using sequential self-limiting reactions. Generally, an ALE cycle is the minimum set of operations used to perform an etch process one time, such as etching a monolayer. The result of one ALE cycle is that at least some of a film layer on a substrate surface is etched. Typically, an ALE cycle includes a modification operation to form a reactive layer, followed by a removal operation to remove or etch only this reactive layer. The cycle may include certain ancillary operations such as removing one of the reactants or byproducts. Generally, a cycle contains one instance of a unique sequence of operations.

As an example, a conventional ALE cycle may include the following operations: (i) delivery of a reactant gas, (ii) purging of the reactant gas from the chamber, (iii) delivery of a removal gas and an optional plasma, and (iv) purging of the chamber. In some embodiments, etching may be performed nonconformally. The modification operation generally forms a thin, reactive surface layer with a thickness less than the un-modified material. In an example modification operation, a substrate may be chlorinated by introducing chlorine into the chamber. Chlorine is used as an example etchant species or etching gas, but it will be understood that a different etching gas may be introduced into the chamber. The etching gas may be selected depending on the type and chemistry of the substrate to be etched. A plasma may be ignited and chlorine reacts with the substrate for the etching process; the chlorine may react with the substrate or may be adsorbed onto the surface of the substrate. The species generated from a chlorine plasma can be generated directly by forming a plasma in the process chamber housing the substrate or they can be generated remotely in a process chamber that does not house the substrate, and can be supplied into the process chamber housing the substrate.

In some instances, a purge may be performed after a modification operation. In a purge operation, non-surface-bound active species (e.g., chlorine) may be removed from the process chamber. This can be done by purging and/or evacuating the process chamber to remove the active species, without removing the adsorbed layer. The species generated in a plasma can be removed by simply stopping the plasma and allowing the remaining species to decay, optionally combined with purging and/or evacuation of the chamber. Purging can be done using any inert gas such as N2, Ar, Ne, He and their combinations.

In a removal operation, the substrate may be exposed to an energy source to etch the substrate. The energy source may include ion bombardment, for instance using argon or helium ions, exposure to photons, which may include activating or sputtering gas or chemically reactive species that induce removal, or by the application of heat. During removal, a bias may be optionally turned on to facilitate directional sputtering and attract ions towards it. The bias power is typically set to a power that prevents sputtering since the power is continuously delivered during this removal operation. In some embodiments, ALE may be isotropic in which etching is performed in multiple directions; in some other embodiments ALE is anisotropic, such as when ions are used in the removal process, in which etching is performed in a specific direction, such as vertically.

In various examples, the modification and removal operations may be repeated in cycles, such as about 1 to about 30 cycles, or about 1 to about 20 cycles. Any suitable number of ALE cycles may be included to etch a desired amount of film. In some embodiments, ALE is performed in cycles to etch about 1 Å to about 50 Å of the surface of the layers on the substrate. In some embodiments, cycles of ALE etch between about 2 Å and about 50 Å of the surface of the layers on the substrate. In some embodiments, each ALE cycle may etch at least about 0.1 Å, 0.5 Å, or 1 Å.

In some instances, prior to etching, the substrate may include a blanket layer of material, such as silicon or germanium. The substrate may include a patterned mask layer previously deposited and patterned on the substrate. For example, a mask layer may be deposited and patterned on a substrate including a blanket amorphous silicon layer. The layers on the substrate may also be patterned. Substrates may have "features" such as via or contact holes, which may be characterized by one or more of narrow and/or re-entrant openings, constrictions within the feature, and high aspect ratios. One example of a feature is a hole or via in a semiconductor substrate or a layer on the substrate. Another example is a trench in a substrate or layer. A feature having a "narrow" opening may be defined as a feature having an opening diameter or line width less than that of a "wide" feature in relative terms. Wide features may have an opening diameter or a critical dimension at least 1.5 times, or at least 2 times, or at least 5 times, or at least 10 times or more than 10 times larger than the critical dimension of narrow features. Examples of "narrow" features include features having an opening diameter between about 10 Å and about 100 Å. Examples of "wide" features include features having an opening diameter on the order of hundreds of Angstroms to about 1 micron. In various instances, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

ALE process conditions, such as chamber pressure, substrate temperature, plasma power, frequency, and type, and bias power, depend on the material to be etched, the composition of the gases used to modify the material to be etched, the material underlying the material to be etched, and the composition of gases used to remove the modified material. However, the combination of these factors make performing ALE for etching a variety of materials challenging. For instance, the conventional energy sources used in the removal operation referenced above may present various disadvantages and challenges. For example, the use of ion bombardment is limited to directional, i.e., anisotropic, etching thereby precluding the ability to etch in numerous directions. While this etching may be able to reach inside deep contacts or trenches, this etching is unable to perform isotropic etching within these areas. Additionally, ion bombardment may cause the mask to erode, to become faceted, or both, which may adversely affect the photolithography operations and may lead to substrate defects.

The materials to which ion bombardment is applicable are also limited because ion bombardment may cause unwanted sputtering of material exposed to the ion bombardment. In sputtering, a material ejects particles when the material is exposed to ions having higher kinetic energy than the surface binding energy of the material. Accordingly, when a substrate with multiple materials that have various surface binding energies is bombarded with ions to etch one material, other materials with surface binding energies less than that one material may be caused to sputter, thereby leading to unwanted removal or degradation of materials on the substrate that may ultimately lead to unwanted substrate defects. "Soft" materials may be considered materials with a surface binding energy less than 4.5 electron-volts (eV) including aluminum (3.19 eV), copper (3.48 eV), germanium (4.29 eV), silver (3.33 eV), and gold (4.13 eV), and "hard" materials may be considered materials with a surface binding energy greater than 4.5 eV, such as silicon (4.73 eV), tantalum (8.1 eV), rhenium (8.0 eV), and Niobium (7.5 eV). Accordingly, a substrate having both soft and hard materials may sputter the soft materials when the substrate is bombarded with ions intended to remove the hard materials. Therefore, materials that can be exposed to ion bombardment for etching are limited.

In another example, exposing the substrate to photons is limited to non-directional, i.e., isotropic, etching, thus preventing etching areas with high aspect ratios, such as inside deep contacts or trenches. Similarly, applying heat as the energy source for the removal operation is also limited to isotropic etching, and may have limited throughput if the etching cannot be cycled between multiple temperatures in an efficient and timely manner.

The use of plasma during the removal operation of conventional etching also presents numerous challenges and disadvantages. For instance, it is generally desirable to create the same plasma conditions for each ALE cycle of a single substrate as well as for all substrates in a batch, but it can be difficult to repeatedly recreate the same plasma conditions due to some plasmas changing due to accumulation of material in the process chamber. Additionally, many conventional ALE processes may cause damage to exposed components of the substrate, such as silicon oxide, may cause defects, and may increase the top-to-bottom ratio of a pattern and increase the pattern loading. Defects may lead to pattern-missing to the extent that the device may be rendered useless. Plasma-assisted ALE also utilizes small radicals, i.e., deeply dissociated radicals, that are more aggressive which causes them to remove more material than may be desired, thereby reducing the selectivity of this etching. As a result, conventional ALE techniques are often unsuitable for selectively etching some materials, such as aluminum dioxide, zirconium dioxide, hafnium dioxide, silicon nitride, and titanium nitride.

Electron Excitation ALE

Provided herein are methods and apparatuses for performing ALE using electrons as the applied energy source, rather than plasma, to drive the removal operation. ALE that relies upon exposure to an electron source, not a plasma, to drive the removal operation may be considered "electron excitation ALE".

FIG. 1 depicts an example process flow diagram for performing operations in accordance with disclosed embodiments. In operation 101, a substrate is provided to a process chamber. The substrate may be a silicon wafer, e.g., a 200-mm wafer, a 300-mm wafer, or a 450-mm wafer, including wafers having one or more layers of material such as dielectric, conducting, or semi-conducting material deposited thereon. A patterned substrate may have "features" such as vias or contact holes, which may be characterized by one or more of narrow and/or re-entrant openings, constrictions within the features, and high aspect ratios. The features may be formed in one or more of the above described layers.

In some embodiments, the substrate does not have any features and the surface of the substrate is a blanket layer of material. In some embodiments, the substrate includes features of various sizes. In various embodiments, types of substrates fabricated from performing disclosed embodiments may depend on the aspect ratios of features on the substrate prior to performing disclosed embodiments. In some embodiments, features on a substrate provided in operation 101 may have an aspect ratio of at least about 2:1, at least about 3:1, at least about 4:1, at least about 6:1, at least about 10:1, at least about 30:1, or higher. The feature may also have a dimension near the opening, e.g., an opening diameter or line width of between about 5 nm to 500 nm, for example between about 25 nm and about 300 nm. Disclosed methods may be performed on substrates with features having an opening less than about 20 nm.

A via, trench or other recessed feature may be referred to as an unfilled feature or a feature. According to various embodiments, the feature profile may narrow gradually and/or include an overhang at the feature opening. A re-entrant profile is one that narrows from the bottom, closed end, or interior of the feature to the feature opening. A re-entrant profile may be generated by asymmetric etching kinetics during patterning and/or the overhang due to non-conformal film step coverage in the previous film deposition, such as deposition of a diffusion barrier. In various examples, the feature may have a width smaller in the opening at the top of the feature than the width of the middle and/or bottom of the feature.

In operation 103, the substrate is exposed to a modification gas for a duration sufficient to modify at least a part of a surface of the substrate. Etching chemistry is introduced into the chamber in operation 103. As described herein, in operations where materials are introduced into the chamber, the reactor or chamber may be stabilized by introducing the chemistry into the chamber prior to processing the substrate or wafer. Stabilizing the chamber may use the same flow rates, pressure, temperatures, and other conditions as the chemistry to be used in the operation following the stabilization. In some embodiments, stabilizing the chamber may involve different parameters. In some embodiments, a carrier gas, such as $N_2$, Ar, Ne, He, and combinations thereof, is continuously flowed during operation 103. In some embodiments, a carrier gas is only used during removal. The carrier gas may be used as a purge gas in some operations as described below.

The modification operation 103 may form a thin, reactive surface layer, or a reactive part of the surface layer, with a thickness that is more easily removed than the un-modified material in the subsequent removal operation. As noted above, in an example modification operation, a substrate may be chlorinated by introducing chlorine into the chamber. Chlorine is used as an example etchant species in disclosed embodiments, but it will be understood that in some embodiments, a different etching gas is introduced into the chamber. The etching gas may be selected depending on the type and chemistry of the substrate to be etched. In some embodiments, chlorine may react with the substrate or may be adsorbed onto the surface of the substrate. In various embodiments, chlorine is introduced into the chamber in a gaseous form and may be optionally accompanied by a carrier gas which may be any of those described above.

In some embodiments, a plasma may be ignited during the modification operation 103 in order to assist with or facilitate the modification of one or more layers of the substrate. In some embodiments, the modification gas is ignited in a remote plasma chamber to generate a plasma species which is then delivered to the process chamber where the substrate is housed. In some embodiments, the modification gas is ignited within the process chamber. For instance, a plasma may be ignited and the chlorine reacts with the substrate for the etching process. The species generated from a chlorine plasma can be generated directly by forming a plasma in the process chamber housing the substrate or they can be generated remotely in a process chamber that does not house the substrate, and can be supplied into the process chamber housing the substrate. In some embodiments, a plasma is not used and chlorine may be introduced thermally into the chamber.

In various embodiments, the plasma may be an inductively coupled plasma or a capacitively coupled plasma. An inductively coupled plasma may be set at a plasma between about 50 W and about 2000 W. In some embodiments, a bias may be applied between about 0V and about 100V, and between about 0V and 500V, for example.

In various embodiments, the plasma may be pulsed during operation 103. The plasma may be pulsed between an ON state at a plasma power between about 50 W and about 2000 W and an OFF state at a plasma power of 0W. In some embodiments, the plasma may be pulsed between a low state at a plasma power between about 10 W and about 100 W and a high state at a plasma power between about 900 W and about 1500 W.

Pulsing may be performed at a pulsing frequency between about 10 Hz and about 200 Hz. The duty cycle of the plasma pulsing for the modification gas may be between about 1% and about 20%. It will be understood that pulsing may involve repetitions of periods, each of which may last a duration T. The duration T includes the duration for pulse ON time (the duration for which the plasma is in an ON state) and the duration for OFF time (the duration from which the plasma is in an OFF state) during a given period. The pulse frequency will be understood as 1/T. For example, for a pulsing period T=100 μs, frequency is 1/T=1/100 μs, or 10 kHz. The duty cycle or duty ratio is the fraction or percentage in a period T during which the energy source is in the ON state such that duty cycle or duty ratio is pulse ON time divided by T. For example, for a pulsing period T=100 μs, if a pulse ON time is 70 μs (such that the duration for which the energy source is in an ON state in a period is 70 μs) and a pulse OFF time is 30 μs (such that the duration for which the energy source is in an OFF state in a period is 30 μs), the duty cycle is 70%.

In some embodiments, plasma is pulsed to allow higher energy to be delivered to the modification gas. In some embodiments, plasma may be pulsed to allow the apparatus used to generate the plasma to operate at certain conditions addressing the limitations of the apparatus. For example, for apparatuses that are unable to deliver plasma power for a short, continuous duration, separating a dose which would be delivered in a short, continuous duration into multiple pulses over a longer period of time such that the plasma ON time overall is the same as the short, continuous duration eases delivery of the plasma power sufficient to modify most or all of the active sites on a substrate surface. For example, if the minimum amount of time needed for chlorine to modify a silicon surface continuously is 400 milliseconds, but the apparatus is incapable of delivering the chlorine gas and plasma power for that short of a continuous duration, the 400 millisecond duration can be delivered over 2 seconds using continuous chlorine gas flow and four cycles of 100 ms pulse of plasma power and 400 ms of no plasma power.

In operation 105, the process chamber is optionally purged to remove excess modification gas molecules that did not modify the substrate surface. In a purge operation, non-surface-bound active species may be removed from the process chamber. This can be done by purging and/or evacuating the process chamber to remove the active species, without removing the adsorbed layer. The species generated in a plasma can be removed by simply stopping the plasma and allowing the remaining species decay, optionally combined with purging and/or evacuation of the chamber. Purging can be done using any inert gas such as $N_2$, Ar, Ne, He and their combinations.

In operation 107, at least one section of the modified surface of the substrate is exposed to an electron source that supplies energy to the modified, reactive surface to enable it to dissociate from the substrate, thereby removing the modified, reactive surface or portions thereof. In some embodiments, the electron source may be a large area source that is configured to expose the entire substrate surface to the electrons at once, i.e., simultaneously. Some embodiments may be a thermionic source which may be formed from lanthanum hexaboride, or the electron source may be a field electron emission source, such as heated tungsten zirconium dioxide ($W/ZrO_2$). In some other embodiments, the electron source may be an electron beam that scans multiple sections of the substrate, or all of the substrate. This electron source may use shaped beams that can be focused on one or more sections of the substrate, and that may be scanned over the sections or over all of the substrate, such as a vector scan that deflects the beam to various positions and sections of the substrate. Another example electron source includes a plasma electron source. These electron sources, and adjustments to these sources and the resulting etch, are described in more detail below.

In operation 109, the charge of the substrate is optionally neutralized. In some embodiments, the charge of the substrate after exposure to the electron source may be higher than prior to the exposure in operation 107 and it is desirable to remove or reduce this charge. For instance, having a substrate with excess charge may adversely affect subsequent processing of the substrate, such as attracting particles which can be detrimental and destructive to the wafers, as well as avoiding electron deflection thereby enabling directionality of processing, including etching. For example, particles may form unintended and highly undesirable shorts within formed integrated circuits on the front side of the wafer. More generally, particles may interfere with subsequent wafer processing. Particles attached to the back side may fall onto another wafer positioned underneath during processing or handling and later cause the problems listed above. For example, wafers are typically stored in cassette-like units, such as Front Opening Unified Pods (FOUPs), where one wafer is positioned directly above another. The particles contaminating the bottom side of one wafer can fall on the front surface of the wafer below. Usually wafers are only supported around the edges, which leaves the front side of one wafer directly exposed to the bottom of the wafer above it.

The charge may be reduced or removed in a number of ways, including, for example, by exposing the substrate to ions from a plasma source such as an inductively coupled plasma, a capacitively coupled plasma, an electron plasma source, or a remote plasma; by exposing the substrate to an ultraviolet light source, such as one or more lamps; by alternatingly exposing the substrate to electrons and ions, which may be from the same electron source as the electron beam; and by depositing a surface conductive layer onto the substrate. Operation 109 may be performed in various sequences, such as the order depicted in FIG. 1, after operation 111, or after 113 before the substrate is removed from the process chamber.

In operation 111, the chamber is optionally purged to remove excess activation gas and reaction byproducts from the removal operation of operation 107.

In operation 113, operations 103-111 are optionally repeated in cycles. In various embodiments, the modification and removal operations may be repeated in cycles, such as about 1 cycle to about 200 cycles, or about 1 cycle to about 150 cycles, or about 1 cycle to about 70 cycles, or about 1 cycle to about 40 cycles, or about 1 to about 30 cycles, or about 1 to about 20 cycles. Any suitable number of ALE cycles may be included to etch a desired amount of film. In some embodiments, ALE is performed in cycles to etch about 0.1 Å to about 50 Å of the surface of the layers on the substrate. In some embodiments, cycles of ALE etch between about 1 Å and about 50 Å of the surface of the layers on the substrate.

Figure 2:
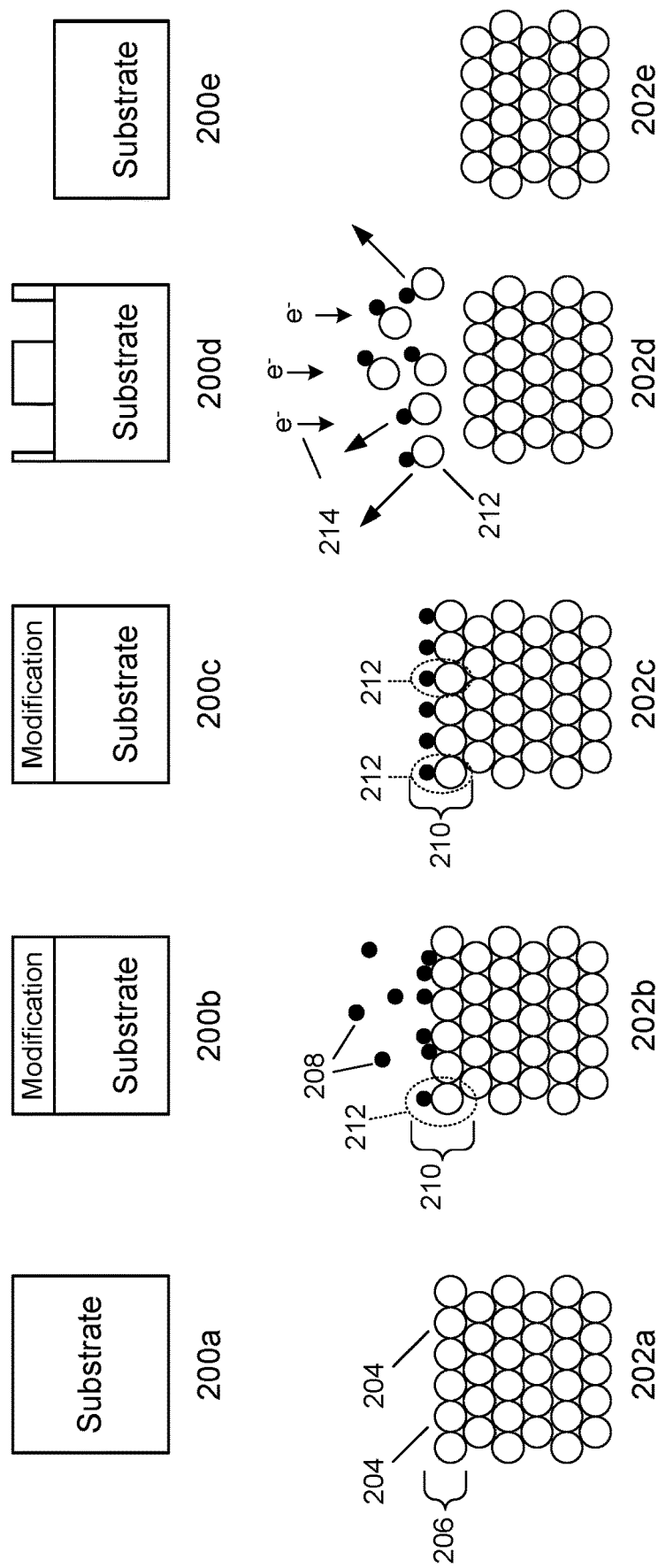
FIG. 2 depicts an example schematic illustration of an electron excitation ALE cycle.

FIG. 2 depicts an example schematic illustration of an electron excitation ALE cycle. Diagrams 200a-200e show an electron excitation ALE cycle. In 200a, the substrate is provided. In 200b, the surface of the substrate is modified. In 200c, the next operation is prepared; this preparation may include flowing a second process gas or purging the chamber. In 200d, the substrate is exposed to an electron source which provides energy to the modified, reactive surface to enable it to dissociate from the substrate, thereby removing the modified, reactive surface or portions thereof. In 200e, the desired material has been removed.

Similarly, diagrams 202a-202e show an example of an electron excitation ALE cycle for etching atoms 204 from a layer of material. In 202a, a substrate is provided, which includes a plurality of atoms, some of which are identified as item 204. The top layer in 202a may be considered a surface layer 206 of material (example materials include silicon and carbon); as seen in 202a, the surface layer 206 of material includes six atoms 204, two of which are identified. In 202b, a first process gas with modifying molecules 208 (the solid black circles, some of which are identified with identifier 208; example molecules include diatomic chlorine and carbon monoxide) is introduced to the substrate which modifies the surface layer 206 of the substrate. The schematic in 202b shows that some of the modifying molecules 208 are adsorbed onto, or reacted with, the atoms 204 of the surface layer 206 of the substrate thereby creating modified surface layer 210 that includes modified molecules 212 (one modified molecule 212 is identified inside a dotted ellipse in 202b; example molecules include carbon dioxide and silicon tetrachloride). In 202c, after the modified molecules 212 and the modified surface layer 210 have been created in 202b, the first processing gas may be optionally purged from the chamber. Here, six modified molecules 212 are seen in the modified surface layer 210, two of which are identified inside dotted ellipses, and the modifying molecules 208 have been removed. In 202d, the substrate is exposed to electrons 214 that provide the energy to the modified molecules 212 thereby enabling the modified molecules 212 to dissociate from, and thus be removed from, the substrate. In 202e, the modified molecules 212, and therefore the modified surface layer 210, have been removed from the substrate. Although a single layer of material was removed in FIG. 2, it is understood that one or more surface layers of material may be removed by such operations.

Figure 3:
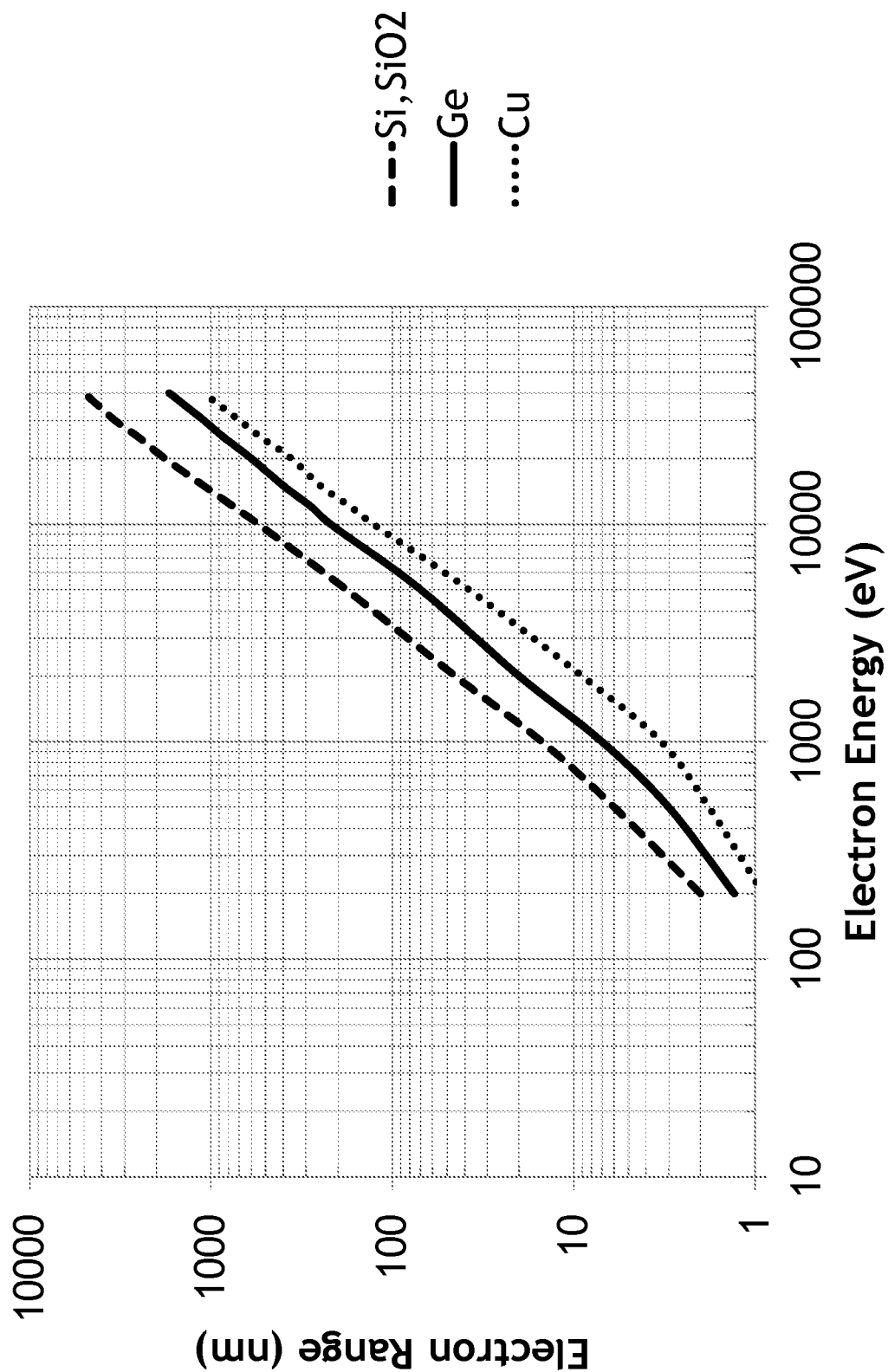
FIG. 3 depicts a graph of various electron penetration depths into materials.

The use of an electron source during the removal operation enables various etch characteristics to be adjusted. For instance, the depth and the type (e.g., isotropic, anisotropic) of the etching, as well as the areas etched, may be adjusted. In some embodiments, the depth of etching may be changed by adjusting the energy level of the electron source. For some electron sources, the depth that the electrons penetrate into a material of a substrate is dependent on the energy level of the electron source. FIG. 3 depicts a graph of various electron penetration depths into materials. The x-axis is the electron energy while the y-axis is the electron range, or penetration depth, into a material and as can be seen, the penetration depth increases into all three example materials (Silicon/silicon dioxide, germanium, and copper) as the electron energy increases. Accordingly, increasing the electron source energy increases the penetration depth of the electrons which in turn increases the depth of material that receives the energy necessary to dissociate the reactive species and thus increases the depth of material that can be etched. Similarly, decreasing the electron source energy decreases the penetration depth and therefore decreases the resulting etching depth.

Figure 4:
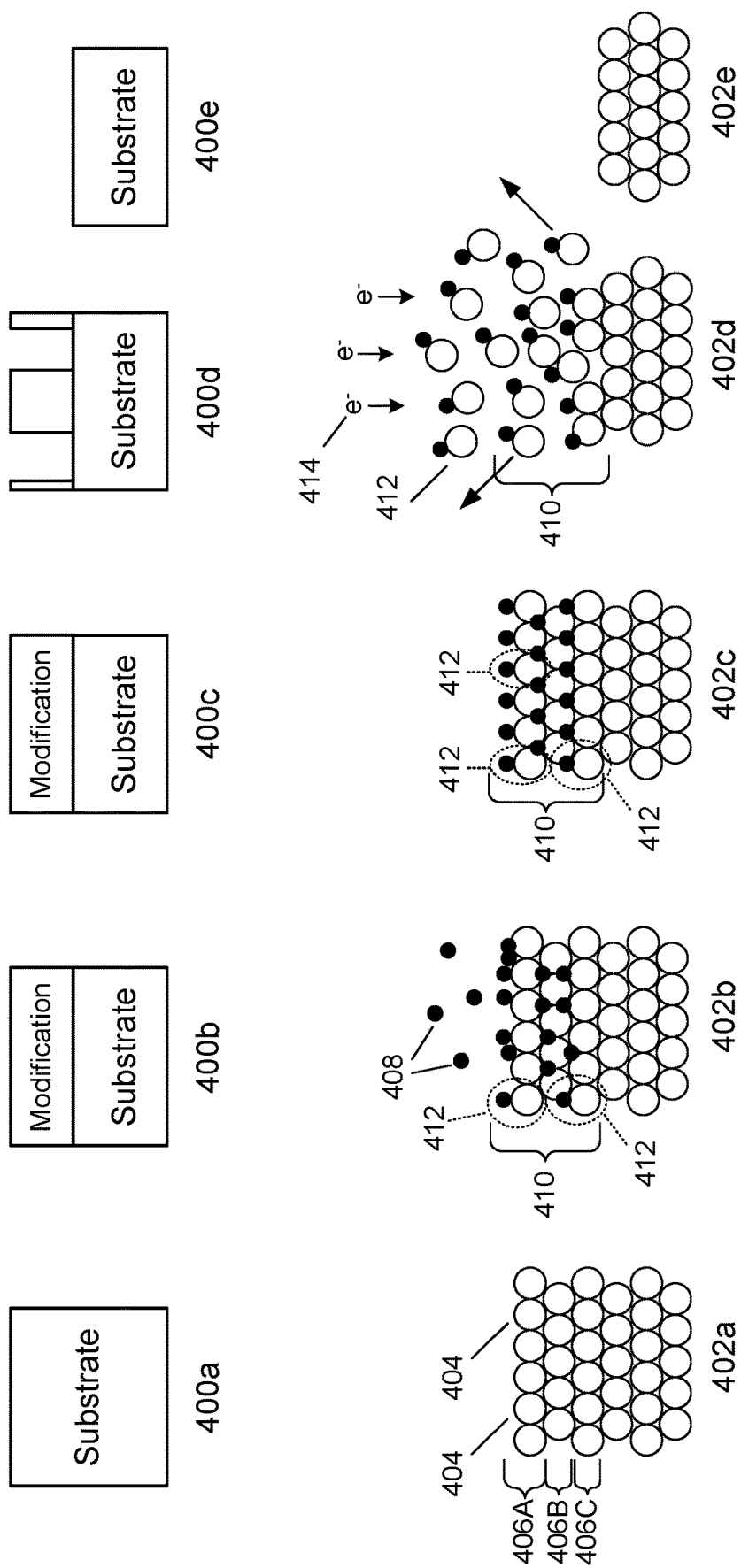
FIG. 4 depicts an example schematic illustration of another electron excitation ALE cycle.

As stated above, the material that is etched is that material which has been modified, which may be a surface layer as well as layers underneath the surface layer; modification of these lower layers may occur through the use of a plasma, downstream radicals, and a neutral gas, during the modification step that can penetrate below the surface layer, for instance. Based on this, the modification and etching of multiple layers using electron excitation ALE may be performed. FIG. 4 depicts an example schematic illustration of another electron excitation ALE cycle. Diagrams 400a-400e show an electron excitation ALE cycle and are similar to diagrams 200a-200e above but illustrate the modification and removal of multiple layers of material. In 400a, the substrate is provided. In 400b, the surface of the substrate, as well as two layers of material underneath the surface, are modified. In 400c, the next operation is prepared; this preparation may include flowing a second process gas or purging the chamber. In 400d, the substrate is exposed to an electron source which provides energy to the modified, reactive surface layer and two lower layers to enable these three layers to dissociate from the substrate, thereby removing them. In 400e, the desired material has been removed.

Diagrams 402a-402e show another example of an electron excitation ALE cycle for etching atoms 404 from a layer of material. In 402a, a substrate is provided, which includes a plurality of atoms, some of which are identified as item 404. The top layer in 402a may be considered a surface layer 406A of material and the two layers underneath the surface layer 406A are identified as layers 406B and 406C. Layers 406A and 406C include six atoms 404, two of which are identified in layer 406A, and layer 406B includes five molecules. In 402b, a first process gas with modifying molecules 408 (the solid black circles, some of which are identified with identifier 408) is introduced to the substrate which modifies the surface layer 406A and the two layers 406B and 406C of the substrate. The schematic in 402b shows that some of the modifying molecules 408 are adsorbed onto, or reacted with, the atoms 404 of the layers 406A, 406B, and 406C, of the substrate thereby creating three modified layers, collectively identified as 410, that include modified molecules 412 (three modified molecules 412 are identified inside dotted ellipses in 402b).

In 402c, after the modified molecules 412 and the modified layers 410 have been created in 402b, the first processing gas may be optionally purged from the chamber. Here, seventeen modified molecules 412 are seen in the modified layers 410, three of which are identified inside dotted ellipses, and the modifying molecules 408 have been removed. In 402d, the substrate is exposed to an electron source with an electron energy that allows electrons 414 to penetrate to all three layers in the modified layers 410 in order to provide the energy to the modified molecules 412 and to enable the removal of the modified molecules 412 in these three modified layers 410 from the substrate. In 402e, the modified molecules 412, and therefore the modified layers 410, have been removed from the substrate.

In some embodiments, electron excitation ALE allows for the type of etching to be adjusted. As mentioned above, etching may be anisotropic (i.e., directional), isotropic (i.e., non-directional), or partially anisotropic. Adjusting the electron source energy may adjust the type of etching that is performed. For instance, if the electron source energy is adjusted so that the electron penetration depth is substantially less (e.g., less than 25%, 15% 10%, 1%, 0.1%, or 0.001%) than the desired etch dimensions (such as the depth, width, or both, of the etch), then the etch may be considered anisotropic. If the electron source energy is adjusted so that the electron penetration depth is greater than or substantially equal to (e.g., within at least 10% or 5%) of the desired etch dimensions, then the etching may be considered isotropic. If the electron source energy is adjusted so that the penetration depth is in-between these ranges, then the etch may be considered partially anisotropic. Accordingly, the electron source may be set to one energy level that is sufficient to cause anisotropic etch (e.g., the electron penetration depth is substantially less (e.g., less than 25%, 15% 10%, 1%, 0.1%, or 0.001%) than the desired etch dimensions), to another energy level that is sufficient to cause isotropic etch (e.g., the electron penetration depth is greater than or substantially equal to (e.g., within at least 10% or 5%) of the desired etch dimensions), and to yet another energy level that is sufficient to cause partially anisotropic etch (e.g., the electron penetration depths is less than the desired etch dimension).

Figure 5:
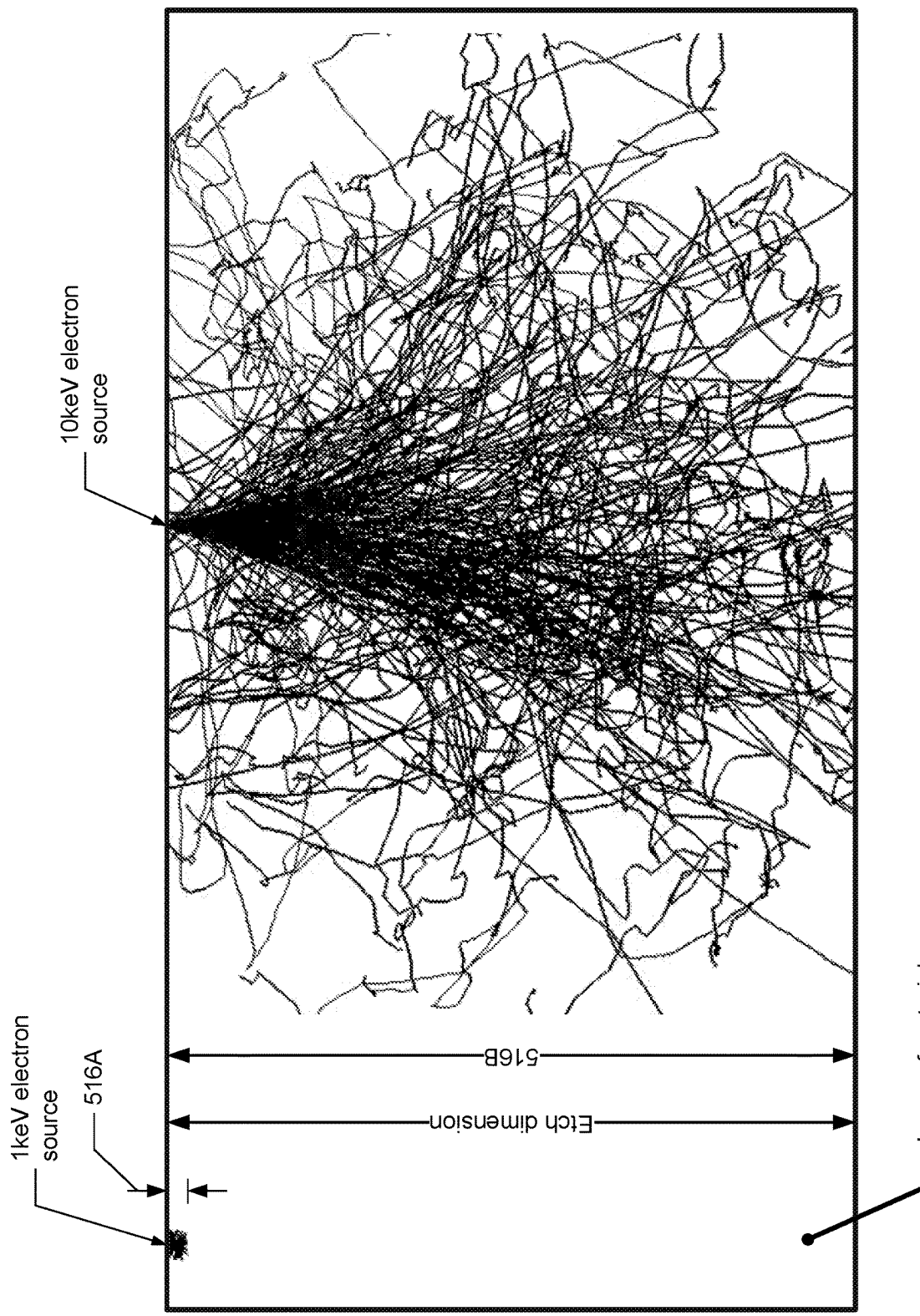
FIG. 5 depicts electron penetrations into a material.

FIG. 5, which depicts electron source penetrations into a material, illustrates this concept. Here, a layer of material is depicted that has an etch dimension, represented as a height in the material; the penetration pattern of two electron sources into the material are also depicted. On the left of FIG. 5, the material was exposed to a 1 keV electron source which had a penetration depth 516A that is significantly less than the etch dimension, e.g., the depicted penetration depth 516A is about 2.5% of the etch dimension (the depth of the depicted material). Accordingly, this 1 keV electron source causes an anisotropic etch. The material of FIG. 5 was also exposed to a 10 keV electron source that has a penetration depth 516B that is greater than or equal to the etch dimension (e.g., the height of the material) in FIG. 5, thereby causing an isotropic etch of the material. Although this example uses height as the etch dimension, the etch dimension may also be a width of the desired etch.

Another example of electron penetration is illustrated with FIGS. 6A-6C which depict electron penetrations into a material with a slot. The y-axis in these Figures is the vertical distance, in nanometers (nm), the x-axis is the horizontal distance also in nm, and the shading indicates electron penetration into the material; the slot in the material is 20 nm wide and 1,000 nm tall. In FIG. 6A, the material was exposed to an electron source having an energy level of 1 keV and as can be seen, electrons penetrate through the top surface of the material and the surface at the bottom of the slot, by a small amount, about 5 nm. The electron source energy is increased to 10 keV in FIG. 6B and to 30 keV in FIG. 6C. As can be seen, the electron source penetrates deeper into the material than at the 1 keV level, such as about 275 nm in FIG. 6B and about 500 nm in FIG. 6C. As can also be seen in FIGS. 6B and 6C, the electrons may penetrate not only through the top surfaces of the material, but also through the side walls and bottom surface of the slot. The greater the energy of the electron source, the greater the penetration into the material. In some embodiments, 6A may be considered anisotropic.

As noted above, using electron excitation ALE, adjustments to the electron source allows for adjustment of the etch performed on the substrate. This includes adjusting the areas or sections of the substrate that are exposed to electron source as well as adjusting the electron source energy, the duration of exposure to the electron source, or both. This adjustability allows for selective removal of the modified surface.

Figure 7:
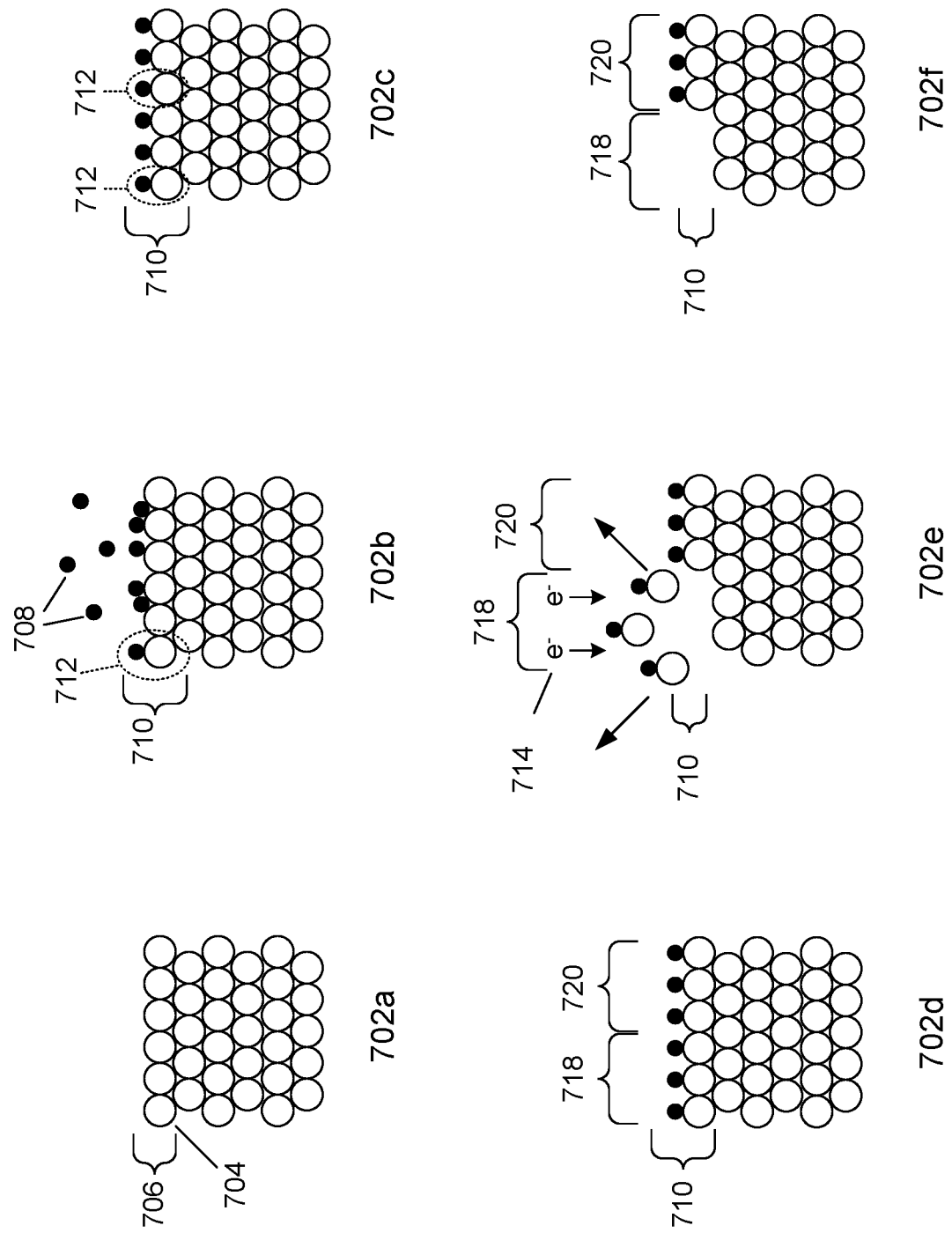
FIG. 7 depicts an example schematic illustration of yet another electron excitation ALE cycle.

For instance, in some embodiments one section of the substrate, not the entire substrate, may be exposed to the electron source. FIG. 7 depicts an example schematic illustration of yet another electron excitation ALE cycle. Here, diagrams 702a-702f show an example electron excitation ALE cycle for etching a section of atoms 704 from a layer of material 706. Diagrams 702a-702c are the same as 202a-202c in which the surface layer 706 of material is modified with modifying molecules 708 that react with or are adsorbed into atoms 704 to form a modified surface layer 710 with modified molecules 712. In 702d, a first section 718 and a second section 720 of the substrate are identified and in 702e, the first section 718 is exposed to the electron source while the second section 720 is not exposed to the electrons 714. This exposure in the first section 718 enables the modified molecules 712 in this first section 718 of the modified surface layer 710 to dissociate from, and thus be removed from, the substrate while the modified molecules 712 in the second section 720 remain on the substrate as can be seen in 702f. Later cycles may continue to modify and etch various sections of the substrate including the first section, both the first and second sections, and other sections that may include a part of the first section or a part of the second section. This exposure to particular sections and regions of the substrate allows for targeted, selective etching to create various geometries as well as to avoid etching other sections.

In some other embodiments, different sections of the substrate may be exposed to different electron source energy levels and to different durations of the electron source. FIG. 8 depicts an example schematic illustration of a different electron excitation ALE cycle and diagrams 802a-802h show another example of an electron excitation ALE cycle for etching atoms 804 from a layer of material. Diagrams 802a-802c are the same as diagrams 402a-402c; for example, the atoms 804 in the top surface layer 806A and two other layers 806B and 806C are modified with modifying molecules 808 to form modified molecules 812 and thus three modified layers 810A, 810B, and 810C, collectively identified as 810.

Similar to 702d described above, a first section 818 and a second section 820 of the substrate are identified in diagram 802d. In diagram 802e, similar to diagram 702e, the first section 818 is exposed to an electron source, and the second section 820 is not exposed to the electron source, in order to cause the removal of modified molecules 812 from the top surface layer 810A in the first section 818 and not from the other layers 810B and 810C, as depicted in diagram 802f. In diagram 802g the second section 820 is exposed to the electron source, the first section 818 is not, in order to supply energy to the modified molecules 812 in all three modified layers 810 and enable their removal from the substrate. In diagram 802f, the result of etching in diagrams 802e and 802f is illustrated; the modified molecules 812 in top surface layer 810A have been removed from the first section 818 of the substrate and the modified molecules 812 in the three modified layers 810 have been removed from the second section 820 of the substrate.

In some embodiments, the first section 818 and second section 820 are exposed to electron sources at different energy levels in order to cause the removal of different layers of material. For instance, the first section 818 may be exposed to an electron source at a first energy level that causes electrons to contact, or penetrate to, the first layer 810A of material but not penetrate to the second or third layers 810B and 810C. This limits the delivered energy for dissociating the modified molecules 812 to just the surface layer 810A. The second section 820 may be exposed to an electron source at a second energy level that causes electrons to contact and penetrate to all three layers 810A-810C in order to deliver the energy necessary to dissociate the modified molecules 812 to all three layers. This second energy level may be higher than the first energy level.

Similarly, instead of varying the electron source energy level between sections, the duration of energy source exposure may be adjusted. For example, the first section 818 may be exposed to an electron source for a first time period which causes electrons to contact, or penetrate to, the first layer 810A of material but not to penetrate to the second or third layers 810B and 810C. This again limits the delivered energy for dissociating the modified molecules 812 to just the surface layer 810A. The second section 820 may be exposed to an electron source for a second time period that causes electrons to contact and penetrate to all three layers 810A-810C in order to deliver the energy necessary to dissociate the modified molecules 812 to all three layers. The electron source energy may be the same during these two time periods.

Additionally, in some embodiments both the energy level and duration of exposure may be different between the two sections such that, for instance, the first section 818 is exposed to an electron source at a first energy level for a first time period and the second section 820 is exposed to an electron source at a second energy level for a second time period thereby etching different levels in each section. Although two sections were discussed herein, any number of sections may be exposed to energy sources at different energy levels and/or for different durations; etching cycles may also be repeated and alternated such that a combination of these exposures are performed, e.g., one cycle exposes the entire surface of the substrate to the electron source, followed by another cycle that exposes one section to the energy source, and followed be another cycle that exposes the one section to the energy source at one energy level and a second section to the energy source at a different energy level.

Figure 9:
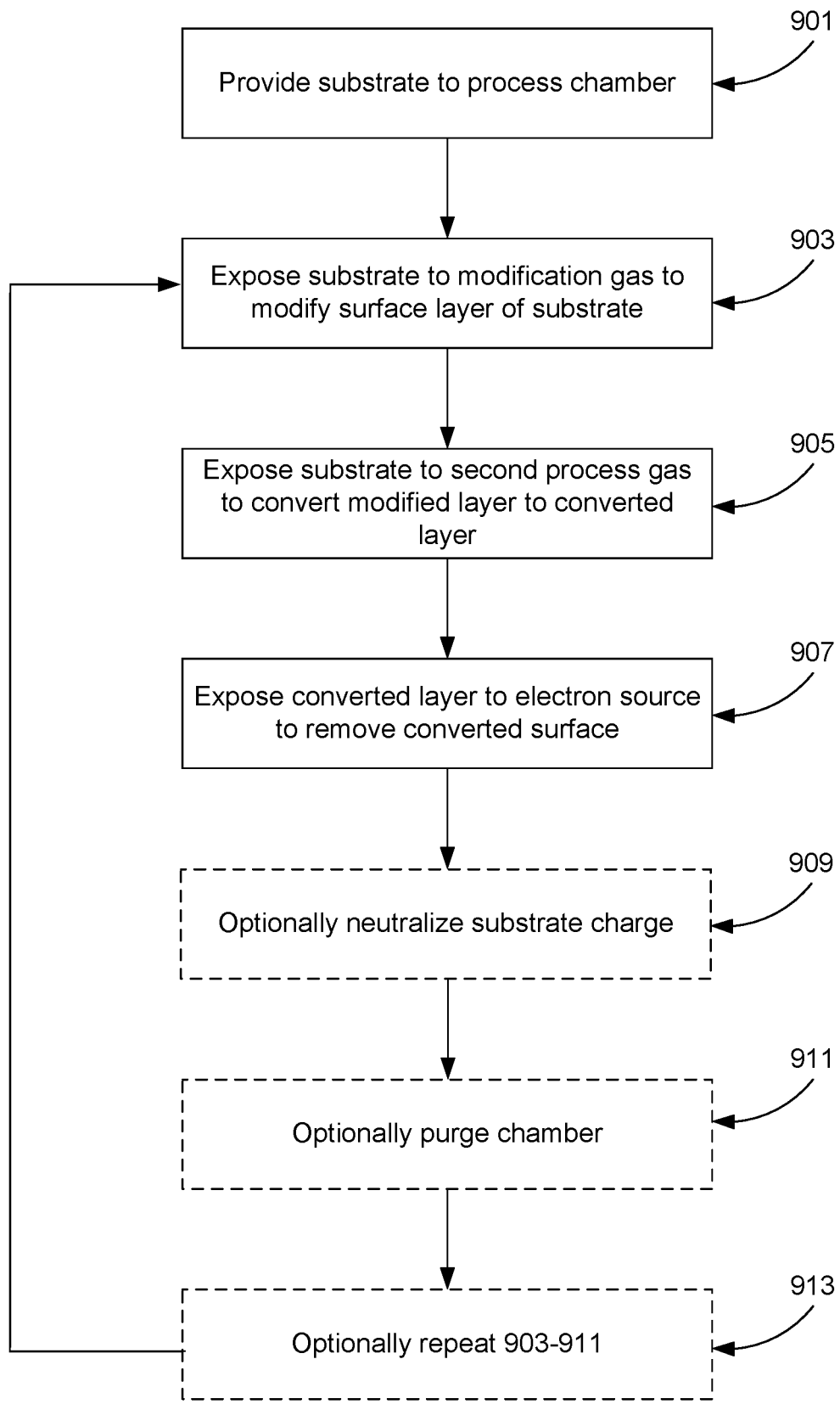
FIG. 9 depicts a second example process flow diagram for performing operations in accordance with disclosed embodiments.

In some embodiments, after the modification operation, a second process gas may be flowed onto the substrate to convert the modified surface layer to a converted layer and the removal operation involves the electron excitation and removal of the converted layer of material. FIG. 9 depicts a second example process flow diagram for performing operations in accordance with disclosed embodiments. The flow diagram of FIG. 9 is similar to that of FIG. 1, with noted differences discussed herein. For instance, operations 901, 903, and 909-913 are the same as operations 101, 103, and 109-113, respectively, discussed above. However, in operation 905, a second process gas with converting molecules is flowed onto the substrate. The converting molecules are configured to react with the modified molecules and created converted molecules in a converted layer of material on the substrate. These converted molecules are volatile molecules that can be dissociated, and therefore removed, from the substrate once the electron source provides the energy to the converted molecules to enable this dissociation, as indicated by operation 907; this operation is similar to operation 107 but here, the converted layer, not the modified layer, is exposed to the electron source to dissociate and remove the converted molecules. In some such embodiments, the modified molecules may not be able to be removed by electron excitation, or it may not be desirable to remove the modified molecules by electron excitations. For example, the surface of the substrate before operation 903 may have aluminum oxide ($Al_2O_3$) and in operation 903 the substrate is exposed to modifying fluorine molecules containing a plasma which modifies the surface to aluminum fluoride ($AlF_3$). In operation 905 the second process gas includes converting molecules dimethylaluminum chloride ($Al(CH_3)_2Cl$; DMAC) which converts the modified aluminum fluoride layer to the converted, volatile layer of dimethylaluminum fluoride ($Al_2Me_4F_2$) that is exposed to the electron source and removed in operation 907. Although one purge operation 911 is included, additional purges may be optionally performed such as in between operations 903 and 905, and between operations 905 and 907. One cycle may be represented by the performance of operations 903-911 and these may be repeated until the desired number of cycles has been performed.

Figure 10:
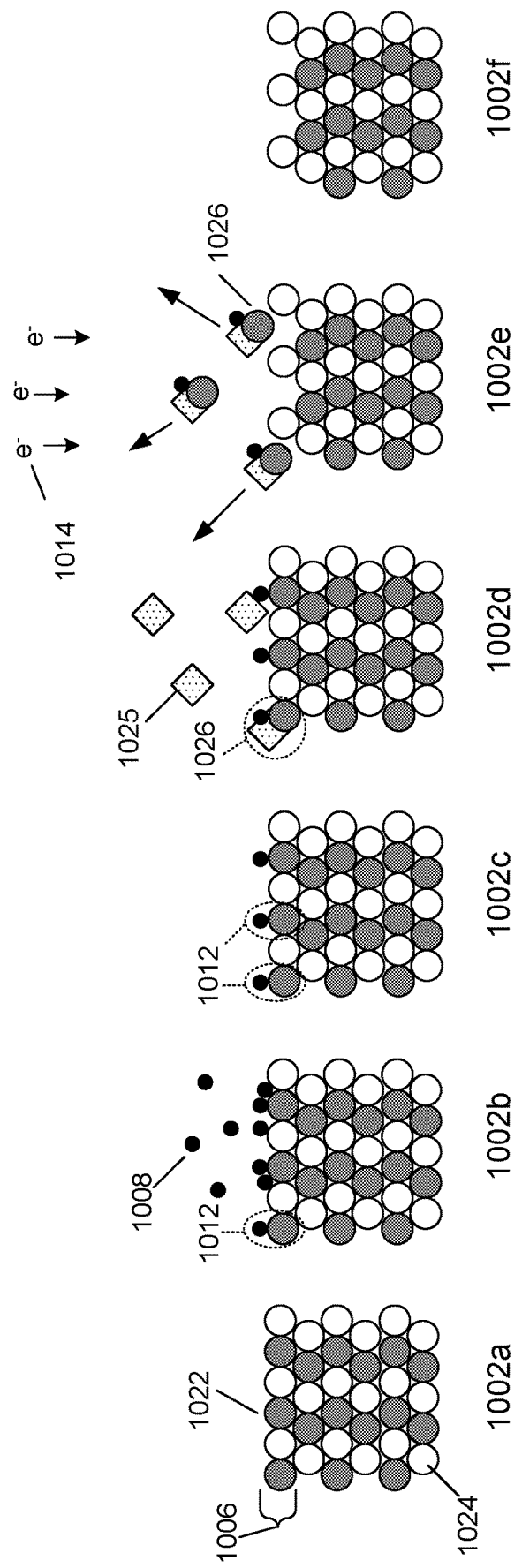
FIG. 10 depicts an example illustration of another electron excitation ALE cycle, like that shown in FIG. 9.

FIG. 10 depicts an example illustration of another electron excitation ALE cycle, like that shown in FIG. 9. Similar to FIGS. 2, 4, 7, and 8, diagrams 1002a-1002f show an example of another electron excitation ALE cycle for etching. In 1002a, a substrate is provided, which includes a first atom 1022 (shaded) and a second atom 1024, three of each are in the surface layer 1006 of the substrate. Like in 202b and 202c, for instance, diagrams 1002b and 202c introduce modifying molecules 1008 (which may be in a first process gas) that react with, or are adsorbed by, the first atoms 1022 to form modified molecules 1012. In some embodiments, the modifying molecules 1008 do not react with, or are not adsorbed by, the second atom 1024. In 1002c, after the modified molecules 1012 have been formed, the modifying molecules 1008 may be optionally purged from the chamber. In 1002d, a second process gas that includes converting molecules 1025 is flowed onto the substrate; these converting molecules 1025 react with, or are adsorbed by, the modified molecules 1012 to form converted molecules 1026 (shown as a grouping of the diamond, shaded circle, and solid circle, one of which is identified in a dotted ellipse labeled 1026) which is volatile. In 1000e, the converted molecules 1026 are exposed to the electrons 1014 which provide energy to the converted molecules 1026 to enable them to dissociate from the substrate and therefore be removed; this is equivalent to etching of the substrate. In 1002f, the chamber is purged and the byproducts are removed. This example results in the selective etching of a first atom from the substrate because the modifying and converting gases were selected to react with and remove the first atom, not the second atom, from the layer of material on the substrate.

There are numerous advantages to using a second process gas to convert the modified layer into a converted layer and to remove the converted layer. For example, some removal of some modified molecules may not be self-limiting when exposed to an electron source which may cause more etching than is desired. Additionally, removal of the converted layer may occur at more advantageous energy levels, such as a lower energy level than that of the modified layer thereby reducing exposure time.

As described above, conventional ALE techniques can be limited to particular materials that are "hard" in terms of sputtering because, for example, a substrate surface that includes both hard and soft materials (e.g., those with a surface binding energy less than 4.5 eV) tends to sputter the soft materials during traditional ALE. However, using the embodiments described herein, a substrate having both hard and soft materials can be etched because exposing the substrate to the electron source does not cause unwanted sputtering of the soft materials.

Electron Excitation ALE Apparatuses

Figure 11:
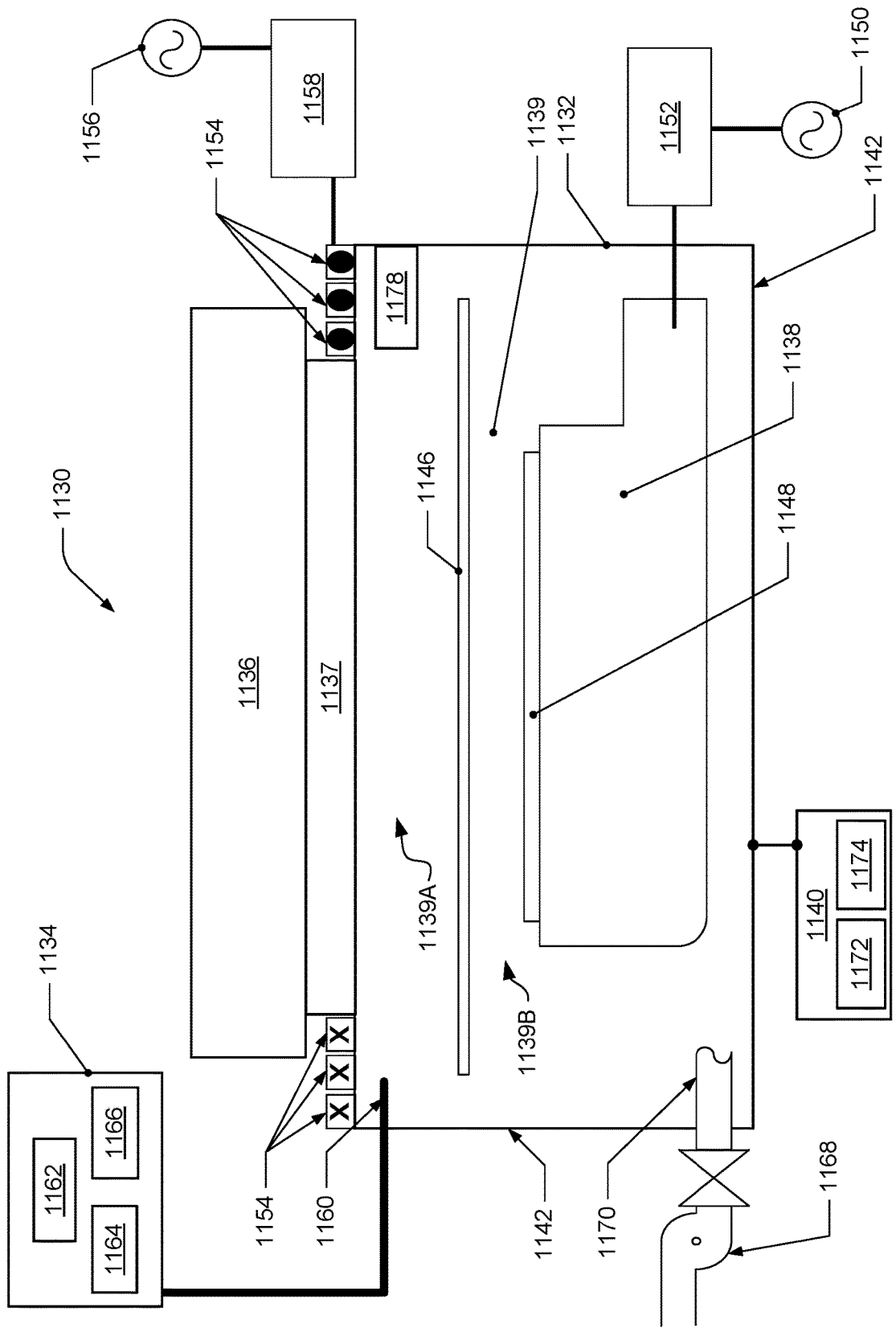
FIG. 11 depicts an example cross-sectional view of an apparatus for semiconductor processing in accordance with disclosed embodiments.

Various embodiments of apparatuses capable of performing electron excitation ALE operations and techniques described above will now be described. FIG. 11 depicts an example cross-sectional view of an apparatus for semiconductor processing in accordance with disclosed embodiments; this apparatus 1130 includes a processing chamber 1132, a process gas unit 1134, an electron source 1136, a wafer support 1138, and a controller 1140. The processing chamber 1132 has chamber walls 1142 that at least partially bound and define a chamber interior 1139 (which may be considered a plenum volume). The chamber walls 1142 may be fabricated from stainless steel or aluminum.

The wafer support 1138 is positioned within the chamber interior 1139 near the bottom inner surface. The wafer support 1138 is configured to position a semiconductor wafer 1148, upon which the etching and deposition processes are performed, in the chamber interior 1139, including receiving and holding the semiconductor wafer 1148. The wafer support 1138 can be an electrostatic chuck for supporting the wafer 1148 when present. In some embodiments, an edge ring (not shown) surrounds wafer support 1138, and has an upper surface that is approximately planar with a top surface of a wafer 1148, when present over wafer support 1138. The wafer support 1138 may also include electrostatic electrodes for chucking and dechucking the wafer. A filter and DC clamp power supply (not shown) may be provided for this purpose. Other control systems for lifting the wafer 1148 off the wafer support 1138 can also be provided. The wafer support 1138 can also be electrically charged using an RF power supply 1150. The RF power supply 1150 is connected to matching circuitry 1152. Bias power may be delivered to wafer support 1138 to bias the substrate 1148. In various embodiments, the bias power may be set to a value between 0V (no bias) and about 2000V, or between 0V and 1800V, or between 0V and 1500V, or between 500V and about 1500V. The matching circuitry 1152 is connected to the chuck wafer support 1138 and in this manner the RF power supply 1150 is connected to the chuck wafer support 1138.

The process gas unit 1134 is configured to flow process gases, which may include liquids and/or gases, such as a reactant, modifying molecules, converting molecules, or removal molecules, onto the substrate 1148 in the chamber interior 1139. The process gas unit 1134 includes one or more inlets through which the process gas flows into the chamber interior 1139, such as inlets on the top of the chamber, not depicted, or side gas flow inlets, such as inlet 1160. The process gas unit 1134 may include a mixing vessel for blending and/or conditioning process gases for delivery to the chamber interior 1139. One or more mixing vessel inlet valves may control introduction of process gases to the mixing vessel.

The process gas unit 1134 may include a first process gas source 1162, a first process liquid source 1164, a vaporization point (not depicted) which may vaporize the first liquid into a gas, and a carrier gas source 1166. Some reactants may be stored in liquid form prior to vaporization and subsequent to delivery to the process chamber 1132. The first process gas may comprise an oxidizing gas, a halogenating gas, ozone, a hydroxylating gas, or another gas configured to modify one or more layers of material on the substrate 1148 as described above. In some implementations, the vaporization point may be a heated liquid injection module. In some other implementations, the vaporization point may be a heated vaporizer. In yet other implementations, the vaporization point may be eliminated from the process station. In some implementations, a liquid flow controller (LFC) upstream of the vaporization point may be provided for controlling a mass flow of liquid for vaporization and delivery to the chamber interior 1139. The carrier gas source 1166 includes one or more carrier gases or liquids that may be flowed with the processing gas; these may be inert gases like $N_2$, Ar, Ne, He.

The apparatus 1130 also includes an electron source 1136 that is configured to expose electrons to the substrate 1148 positioned on the wafer support 1138. As stated above, the electron source 1136 may be a broad beam or large area source that is configured to expose the entire substrate 1148 surface to the electrons at once, i.e., simultaneously. Some embodiments may be a thermionic source which may be formed from lanthanum hexaboride, or the electron source may be a field electron emission source, such as heated tungsten zirconium dioxide ($W/ZrO_2$). In some other embodiments, the electron source 1136 may be an electron beam that scans multiple sections of the substrate 1148, or all of the substrate, and that may use shaped beams to focus the beam on one or more sections of the substrate 1148 and to scan various sections of the substrate 1148, such as a vector scan. In some embodiments, the electron source may be an electron plasma source. An isolation valve, or a shutter, 1137 may also be included in the apparatus 1130. The isolation valve is interposed between the chamber 1132 and the electron source 1136 and it is configured to allow the electrons to enter the chamber interior 1139, to prevent the electrons from entering the chamber interior 1132, and to prevent gases and particles from the chamber interior 1139 traveling to the electron source 1136.

The apparatus 1130 may also include a vacuum pump 1168 that is configured to generate a vacuum in the chamber interior 1139, including a one or two stage mechanical dry pump and/or turbomolecular pump that may be used to draw process gases out of the process chamber interior 1139 and to maintain a pressure within the process chamber 1132. For example, the pump 1168 may be used to evacuate the chamber interior 1139 during a purge operation of ALE. A valve-controlled conduit may be used to fluidically connect the vacuum pump to the processing chamber 1132 so as to selectively control application of the vacuum environment provided by the vacuum pump 1168. This may be done employing a closed loop-controlled flow restriction device, such as a throttle valve (not shown) or a pendulum valve (not shown), during operational plasma processing. The apparatus 1130 is configured to maintain the chamber interior 1139 at a vacuum while the isolation valve 1137 is open and while the substrate 1148 is exposed to the electron beam from the electron source 1136.

As noted above, the apparatus may include a plasma generator for using or generating a plasma in the chamber interior 1139, such as a capacitively coupled plasma (CCP), an inductively coupled plasma (ICP), and a remote plasma. The apparatus 1130 of FIG. 11 includes a plasma generator that has ICP features such as a coil 1154 positioned above the chamber 1132. The coil 1154 is fabricated from an electrically conductive material and includes at least one complete turn. The example of a coil 1154 shown in FIG. 11 includes three turns. The cross sections of coil 1154 are shown with symbols, and coils having an "X" extend rotationally into the page, while coils having a "●" extend rotationally out of the page. Elements for plasma generation also include an RF power supply 1156 configured to supply RF power to the coil 1154. In general, the RF power supply 1156 is connected to matching circuitry 1158 and the matching circuitry 1158 is connected to the coil 1154. In this manner, the RF power supply 1156 is connected to the coil 1154. The RF power supply 1156 may be configured to be pulsed at a frequency between 10 Hz and 200 Hz using a duty cycle between 1% and about 20% during the modification operation, and/or pulsed at a frequency between 10 Hz and 200 Hz using a duty cycle between 1% and about 20% during the removal operation for an ALE cycle. The plasma generator is not identified as a single element in FIG. 11, but it includes, the coil 1154, the RF power supply 1156, and optionally the matching circuitry 1158)

Although not depicted, an optional Faraday shield may be positioned between the coil 1154 and the chamber 1132. The Faraday shield may be maintained in a spaced-apart relationship relative to the coil 1154. The Faraday shield may be disposed immediately above the chamber 1132. The coil 1154, the Faraday shield, and the top wall of the chamber 1132 may each be configured to be substantially parallel to one another. The Faraday shield may prevent metal or other species from depositing on the chamber 1132.

An optional internal plasma grid 1146 may divide the overall processing chamber 1139 into an upper sub-chamber 1139A and a lower sub-chamber 1139B. In most embodiments, plasma grid 1146 may be removed, thereby utilizing a chamber space made of sub chambers 1139A and 113B.

Radio frequency power is supplied from the RF power supply 1156 to the coil 1154 to cause an RF current to flow through the coil 1154. The RF current flowing through the coil 1154 generates an electromagnetic field about the coil 1154. The electromagnetic field generates an inductive current within the upper sub-chamber 1139A. The physical and chemical interactions of various generated ions and radicals with the wafer 1148 may selectively modify layers of the wafer 1148. If the plasma grid 1146 is used such that there is both an upper sub-chamber 1139A and a lower sub-chamber 1139B, the inductive current acts on the gas present in the upper sub-chamber 1139A to generate an electron-ion plasma in the upper sub-chamber 1139A. The optional internal plasma grid 1146 limits the amount of hot electrons in the lower sub-chamber 1139B. In some embodiments, the apparatus 1130 is designed and operated such that the plasma present in the lower sub-chamber 1139B is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 1139B through port 1170. The wafer support 1138 disclosed herein may operate at temperatures ranging between about −200° C. and about 600° C. or between about −20° C. and about 250° C., the wafer support 1138 may be set at a temperature less than about 0° C. The temperature will depend on the process operation and specific recipe and the tool used.

Chamber 1132 may be coupled to facilities (not shown) when installed in a clean room or a fabrication facility. Facilities include plumbing that provide processing gases, vacuum, temperature control, and environmental particle control. These facilities are coupled to chamber 1132, when installed in the target fabrication facility. Additionally, chamber 1132 may be coupled to a transfer chamber that allows robotics to transfer semiconductor wafers into and out of chamber 1132 using typical automation.

The system controller 1140 (which may include one or more physical or logical controllers) controls some or all of the operations of a processing chamber. The system controller 1140 may include one or more memory devices 1172 and one or more processors 1174. In some embodiments, the apparatus includes a switching system for controlling flow rates and durations when disclosed embodiments are performed. In some embodiments, the apparatus may have a switching time of up to about 500 ms, or up to about 750 ms. Switching time may depend on the flow chemistry, recipe chosen, reactor architecture, and other factors.

In some implementations, the controller 1140 is part of a system or the apparatus 1130, which may be part of the above-described examples. Such systems can comprise semiconductor processing equipment, including a processing tool or tools, chamber or chambers, a platform or platforms for processing, and/or specific processing components (a wafer substrate support, a gas flow system, etc.). These systems may be integrated with electronics for controlling their operation before, during, and after processing of a semiconductor wafer or substrate. The electronics may be referred to as the "controller," which may control various components or subparts of the system or systems. The controller 1140, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 1140 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer. In some embodiments, the controller 1140 may be used to determine a window for temperature for the modification operation of ALE, or to determine a window for process conditions for the removal operation of ALE, or both.

The controller 1140, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 1140 receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 1140 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 1140 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

In some embodiments, the controller 1140 includes instructions that are configured to execute some or all of the techniques described above. For example, these instructions may be configured to cause the process gas unit 1134 to flow the first process gas to the substrate 1148 in the chamber interior 1139 and the first process gas is configured to modify one or more layers of material on the substrate 1148, to cause the electron source 1136 to generate the electrons and thereby expose the one or more modified surface layers on the substrate 1148 to the electron source without using a plasma, and to control the vacuum pump 1168 to generate a vacuum in the chamber interior 1139 and purge the gases from the chamber interior 1139. This may also include the controller causing the shutter valve 1157 to be closed during a modification operation and open during a removal operation.

Figure 12:
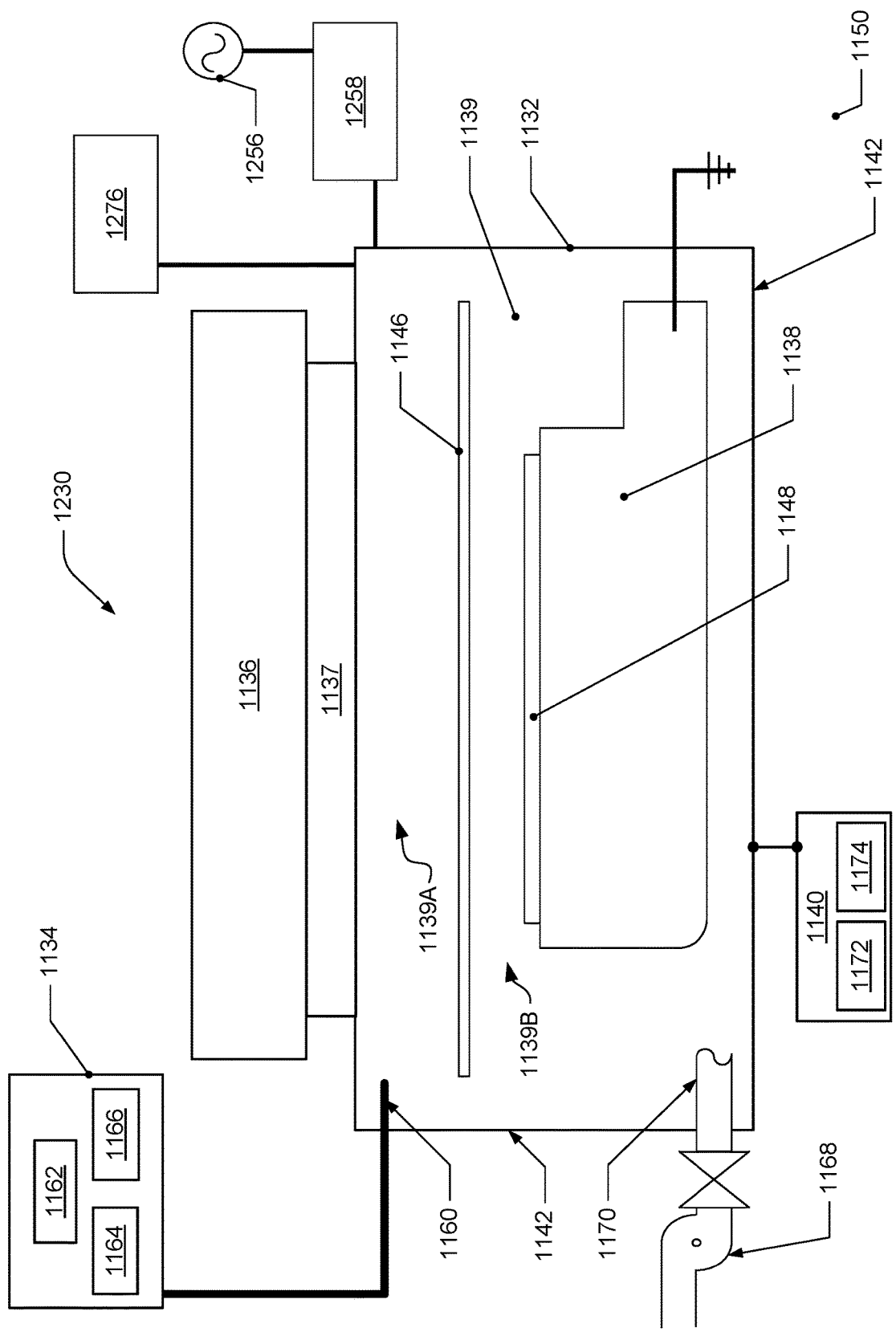
FIG. 12 depicts an example cross-sectional view of another apparatus for semiconductor processing in accordance with disclosed embodiments.

The controller 1140 may also be configured to cause the plasma generator to generate a plasma in the chamber interior 1139, such as during the modification operation described above as well as to reduce or neutralize the charge of the substrate after exposure to the electron source. The plasma generator may include coil 1154, matching circuitry 1158, and the RF power supply 1156. In some other embodiments, the plasma generator is a CCP or remote plasma source. FIG. 12 depicts an example cross-sectional view of another apparatus for semiconductor processing in accordance with disclosed embodiments. Here, the apparatus 1230 is the same as in FIG. 11, but the coil has been removed and two other types of plasma generators are depicted. One type is a CCP plasma generator in which the RF power source 1256 is connected to the matching circuitry 1258 which is connected directly to the chamber 1132 itself that generates the plasma using capacitive coupling between a powered electrode and a grounded electrode; the powered electrode, which may be connected with the plasma RF power source 1256, may correspond with the RF electrode in the chamber interior. The grounded electrode may correspond with the substrate support 1138. The second type is a remote plasma source 1276 that is connected to the chamber 1132 and configured to flow radicals into the chamber interior 1139. The electrodes may be configured to produce RF energy in the 13.56 MHz range, 27 MHz range, or, more generally, between 50 Khz and 60 MHz. In some embodiments, there may be multiple electrodes provided which are each configured to produce a specific frequency range of RF energy.

In some embodiments, the apparatus may include a charge neutralization unit that is configured to reduce or remove a charge on the substrate. This charge neutralization unit may include the plasma generator described herein, the electron source described herein, as well as an ultraviolet light source 1178 shown in FIG. 11. The controller 1140 may include instructions to generate a plasma in the chamber interior 1139 that reduces or eliminates the charge on the substrate 1148, to cause the electron source 1136 to alternatively expose the substrate 1148 to electrons and ions which reduces or eliminates the charge on the substrate 1148, and to cause the ultraviolet light source 1178 to produce ultraviolet light that reduces or eliminates the charge on the substrate 1148. This ultraviolet light may have wavelengths between about 50 nm and about 250 nm.

Performing electron excitation ALE using the techniques and apparatuses described herein provides numerous advantages. For example, these techniques and apparatuses allow for the isotropic etching of layers of material inside deep contacts or trenches whereas conventional ALE is limited to anisotropic etching within these areas; these areas can also be etched without causing ion damage. Additionally, these techniques and apparatuses enable ALE of materials that have a high sputter yield, e.g., soft materials, without causing these soft materials to sputter. As described above, the nature of the etching can be adjusted between isotropic, anisotropic, and partially anisotropic etching, and various adjustments to the electron source energy, to the areas on the substrate exposed to the electron source, and the duration of exposure enable targeted, selected etching to form various geometries. These techniques and apparatuses also reduce or eliminate faceting and erosion of masks thereby providing better critical depth control.

While the subject matter disclosed herein has been particularly described with respect to the illustrated embodiments, it will be appreciated that various alterations, modifications and adaptations may be made based on the present disclosure, and are intended to be within the scope of the present invention. It is to be understood that the description is not limited to the disclosed embodiments but, on the contrary, is intended to cover various modifications and equivalent arrangements included within the scope of the claims.

What is claimed is:

1. A method of processing a substrate, the method comprising:
reacting modifying molecules with one or more surface layers of material on the substrate to form one or more modified surface layers;
exposing the one or more modified surface layers on the substrate to an electron source thereby removing, without using a plasma, the one or more modified surface layers on the substrate; and
further comprising:
neutralizing, after the exposing, a charge on the substrate.

2. The method of claim 1, wherein the exposing further comprises simultaneously exposing all of the one or more modified surface layers on the substrate to the electron source.

3. The method of claim 1, wherein the exposing further comprises exposing a first section of the one or more modified surface layers to the electron source.

4. The method of claim 3, wherein only the first section of the one or more modified surface layers is exposed to the electron source while a second section of the one or more modified surface layers is not exposed to the electron source.

5. The method of claim 3, wherein the exposing further comprises exposing a second section of the one or more modified surface layers to the electron source after the exposing of the first section.

6. The method of claim 5, wherein the exposing further comprises:
exposing the first section of the one or more modified surface layers to the electron source at a first beam energy level, and
exposing the second section of the one or more modified surface layers to the electron source at a second beam energy level.

7. The method of claim 5, wherein the exposing further comprises:
exposing the first section of the one or more modified surface layers to the electron source for a first time period, and
exposing the second section of the one or more modified surface layers to the electron source for a second time period.

8. The method of claim 1, wherein the exposing further comprises exposing the one or more modified surface layers on the substrate to the electron source at a beam energy level that is sufficient to cause anisotropic removal of the one or more modified surface layers from the substrate.

9. The method of claim 1, wherein the exposing further comprises exposing the one or more modified surface layers on the substrate to the electron source at a beam energy level that is sufficient to cause isotropic removal of the one or more modified surface layers from the substrate.

10. The method of claim 1, wherein the exposing further comprises exposing the one or more modified surface layers on the substrate to the electron source at a beam energy level that is sufficient to cause partial anisotropic removal of the one or more modified surface layers from the substrate.

11. The method of claim 1, further comprising:
flowing, before or during the modifying, a first process gas onto the substrate, wherein the first process gas is configured to modify the one or more surface layers of material on the substrate.

12. The method of claim 1, wherein the modifying further comprises exposing the one or more surface layers of material on the substrate to a plasma.

13. The method of claim 1, further comprising:
repeating, while the substrate remains in a processing chamber, the modifying of one or more surface layers of material on the substrate and the exposing the one or more modified surface layers on the substrate to the electron source.

14. The method of claim 13, further comprising:
purging the processing chamber between modifying and exposing operations.

15. The method of claim 1, wherein the material has a surface binding energy of less than about 4.5 electron volts (eV).

16. The method of claim 15, wherein the material comprises one or more of: germanium, gold, and silver.

17. The method of claim 1, wherein substrate temperature during the modifying and the exposing is substantially the same.

18. The method of claim 1, wherein the modifying molecules comprise diatomic chlorine or carbon monoxide.

19. A method of processing a substrate, the method comprising:
reacting modifying molecules with one or more surface layers of material on the substrate to form one or more modified surface layers;
converting, after the reacting, the one or more modified surface layers on the substrate to one or more converted layers;
exposing the one or more converted layers on the substrate to an electron source thereby removing, without using a plasma, the one or more converted surface layers on the substrate; and
further comprising:
neutralizing, after the exposing, a charge on the substrate.

20. The method of claim 19, wherein the converting further comprises flowing a second process gas onto the substrate, wherein the second process gas is configured to convert the one or more modified surface layers on the substrate to the one or more converted layers.

21. The method of claim 19, wherein the modifying further comprises exposing the one or more surface layers of material on the substrate to a plasma.

22. The method of claim 19, wherein the converting further comprises exposing the one or more surface layers of material on the substrate to a plasma.

23. The method of claim 19, wherein the modifying molecules comprise diatomic chlorine or carbon monoxide.

* * * * *